(12) United States Patent
van Hest et al.

(10) Patent No.: US 11,390,533 B2
(45) Date of Patent: Jul. 19, 2022

(54) COMPOSITIONS FOR SOLUTION PROCESSING OF PEROVSKITES AND METHODS OF MAKING THE SAME

(71) Applicants: Alliance for Sustainable Energy, LLC, Golden, CO (US); The Regents of the University of Colorado, a body corporate, Denver, CO (US)

(72) Inventors: Marinus Franciscus Antonius Maria van Hest, Lakewood, CO (US); David Todd Moore, Arvada, CO (US); Benjia Dou, Cambridge, MA (US)

(73) Assignees: Alliance for Sustainable Energy, LLC, Golden, CO (US); The Regents of the University of Colorado, a Body Corporate, Denver, CO (US)

( * ) Notice: Subject to any disclaimer, the term of this patent is extended or adjusted under 35 U.S.C. 154(b) by 227 days.

(21) Appl. No.: 16/715,224

(22) Filed: Dec. 16, 2019

(65) Prior Publication Data
US 2020/0189926 A1    Jun. 18, 2020

Related U.S. Application Data

(60) Provisional application No. 62/779,618, filed on Dec. 14, 2018.

(51) Int. Cl.
    *C01F 17/30*          (2020.01)
(52) U.S. Cl.
    CPC .......... *C01F 17/30* (2020.01); *C01P 2002/34* (2013.01); *C01P 2002/70* (2013.01); *C01P 2002/82* (2013.01); *C01P 2002/84* (2013.01)

(58) Field of Classification Search
    CPC .. C01F 17/30; C01P 2002/34; C01P 2002/70; C01P 2002/82; C01P 2002/84; Y02E 10/549; H01L 51/422
See application file for complete search history.

(56) References Cited

U.S. PATENT DOCUMENTS 6,136,229 A * 10/2000 Cui ...................... C01G 23/003
                                                        252/500

FOREIGN PATENT DOCUMENTS

EP            3147262 A1      3/2017

OTHER PUBLICATIONS

Dou, B. et al., "High-Performance Flexible Perovskite Solar Cells on Ultrathin Glass: Implications of the TCO," Journal of Physical Chemistry Letters, vol. 8, 2017, pp. 4960-4966.
Eperon, G. et al., "Formamidinium lead trihalide: a broadly tunable perovskite for efficient planar heterojunction solar cells," RSC Energy Environmental Science, vol. 7, 2014, 7 pages.
Eperon, G. et al., "Cation exchange for thin film lead iodide perovskite interconversion," RSC Materials Horizons, vol. 3, 2016, 9 pages.
Galagan, Y., "Perovskite Solar Cells: Toward Industrial-Scale Methods," Journal of Physical Chemistry Letters, vol. 9, 2018, pp. 4326-4335.

(Continued)

*Primary Examiner* — Anthony J Zimmer
(74) *Attorney, Agent, or Firm* — Michael A. McIntyre

(57) ABSTRACT

The present disclosure relates to a composition that includes a perovskite crystal, where the perovskite crystal is in the form of a powder, and the perovskite crystal is semiconducting and photovoltaically active.

12 Claims, 39 Drawing Sheets

(56) References Cited

OTHER PUBLICATIONS

Garcia-Fernandez, A. et al., "Phase Transition, Dielectric Properties, and Ionic Transport in the [(CH3)2NH2]PbI3 Organic-Inorganic Hybrid with 2H-Hexagonal Perovskite Structure," Inorganic Chemistry, vol. 56, 2017, pp. 4918-4927.

Idrees, M. et al., "The organic residue and synthesis of LaFeO3 by combustion of citrate and nitrate precursors," Materials Chemistry and Physics, vol. 162, 2015, pp. 652-658.

Ju, D. et al., "Gas induced conversion of hybrid perovskite single crystal to single crystal for great enhancement of their photoelectric properties," Journal of Materials Chemistry A, vol. 5, 2017, 7 pages.

Lee, M. V. et al., "Transamidation of dimethylformamide during alkylammonium lead triiodide film formation for perovskite solar cells," JMR Early Career Scholars in Materials Science Annual Issue, Journal of Materials Research, vol. 32, No. 1, Jan. 13, 2017, 11 pages.

Lisnevskaya, I.V. et al., Synthesis of Multiferroics BiFe0.5B0.5O3, Russian Journal of Inorganic Chemistry, vol. 60, No. 2, 2015, pp. 140-146.

Mancini, A. et al., "Synthesis, structural and optical characterization of APbX3 (A=methylammonium, dimethylammonium, trimethylammonium; X=I, Br, Cl) hybrid organic-inorganic materials," Journal of Solid State Chemistry, vol. 240, 2016, pp. 55-60.

Noel, N. et al., "Unveiling the Influence of pH on the Crystallization of Hybrid Perovskites, Delivering Low Voltage Loss Photovoltaics," Joule, vol. 1, 2017, pp. 328-343.

Pratsinis, Prof. S.E., "Milling & Analysis of Particles," Swiss Federal Institute of Technology Zurich, Particle Technology Laboratory, accessed at http://www.ptl.ethz.ch, 20 pages.

Prochowicz, D. et al., "Mechanosynthesis of the hybrid perovskite CH3NH3PbI3: characterization and the corresponding solar cell efficiency," Journal of Materials Chemistry A, vol. 3, 2015, pp. 20772-20777.

Roldan-Carmona, C. et al., "High efficiency methylammonium lead triiodide perovskite solar cells: the relevance of non-stoichiometric precursors," RSC Energy & Environmental Science, vol. 8, 2015, 7 pages.

Sadhukhan, P. et al., "Solvent-Free Solid-State Synthesis of High Yield Mixed Halide Perovskites for Easily Tunable Composition and Band Gap," Crystal Growth & Design, vol. 18, 2018, pp. 3428-3432.

Saliba, M. et al., "Cesium-containing triple cation perovskite solar cells: improved stability, reproducibility and high efficiency," Energy & Environmental Science, vol. 9, 2016, 9 pages.

* cited by examiner

COMPOSITIONS FOR SOLUTION PROCESSING OF PEROVSKITES AND METHODS OF MAKING THE SAME

CROSS-REFERENCE TO RELATED APPLICATIONS

This application claims priority from U.S. Provisional Patent Application No. 62/779,618 filed Dec. 14, 2018, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Metal halide perovskites (MHP) have the general structure of $ABX_3$, where A is a monovalent cation, B is a divalent metal, and X is a halide. There is an extraordinary degree of tunability within this general formula. Alloyed materials with two or even three A-site and X-site constituents have demonstrated advantages over the single cation/halide MHPs such as methylammonium lead triiodide ($MAPbI_3$), formamidinium lead iodide ($FAPbI_3$) or cesium lead triiodide ($CsPbI_3$). Specifically, carefully designed alloys offer the potential to tune the perovskite structure for improved compositional and phase stability, enhanced performance and tunable band gap. Developing scalable, stable precursors for these alloyed materials is important for industrial-scale production of solution-based MHP optoelectronic technologies. Moreover, the preparation of MHP inks for laboratory-scale research, particularly in the case of complex alloys, requires meticulous measuring of precursor materials to control the fine stoichiometry of the precursor solution, i.e. ink. Precise control of stoichiometry is difficult but also very important for reproducible and reliable experimentation and manufacturing. Even slight solution compositional changes can manifest themselves in changes in the batch-to-batch MHP stoichiometry, which in turn, modifies the resulting perovskite materials' optoelectronic properties and stability. Thus, there remains a need for stable compositions and methods for producing stable and predictable perovskite materials, in particular to meet the stringent requirements of a manufacturing environment.

SUMMARY

An aspect of the present disclosure is a composition that includes a perovskite crystal, where the perovskite crystal is in the form of a powder, and the perovskite crystal is semiconducting and photovoltaically active. In some embodiments of the present disclosure, the powder may have a particle size between about 1 μm and about 1 mm. In some embodiments of the present disclosure, the perovskite crystal may include at least one of a three-dimensional (3D), a two-dimensional (2D), a one-dimensional (1D), and/or a zero-dimensional (0D) perovskite. In some embodiments of the present disclosure, the perovskite crystal may have a stoichiometry defined by $ABX_3$, where A may be a first cation, B may be a second cation, and X may be an anion. In some embodiments of the present disclosure, the first cation may include at least one of formamidinium (FA), methylammonium (MA), and/or cesium.

In some embodiments of the present disclosure, the composition may be substantially free of dimethylammonium ($DMA^+$). In some embodiments of the present disclosure, the composition is substantially free of dimethylammonium ($DMA^+$). In some embodiments of the present disclosure, the absence of $DMA^+$ may be determined by time-of-flight secondary ion mass spectrometry. In some embodiments of the present disclosure, where the composition may further include a perovskite precursor. In some embodiments of the present disclosure, the perovskite precursor may include at least one of $PbI_2$, methylammonium bromide (MABr), methylammonium iodide (MAI), and/or cesium iodide (CsI).

An aspect of the present disclosure is a photovoltaic device that includes a layer of a perovskite material, where the perovskite material is substantially free of dimethylammonium formate (DMAF).

An aspect of the present disclosure is a method that includes metering a first amount of a first salt that includes a first cation (A) and a halogen (X), metering a second amount of a second salt that includes a second cation (B) and the halogen, and combining the first amount and the second amount, resulting in a first solid mixture, where both the first salt and the second salt are solid, and the first salt and the second salt provide a stoichiometry of the first cation, the second cation, and the anion corresponding to a perovskite. In some embodiments of the present disclosure, the method may further include mixing the first solid mixture, where the mixing converts at least a portion of the first solid mixture to a second solid mixture that includes the perovskite. In some embodiments of the present disclosure, the second solid mixture may have a particle size between about 1 μm and about 1 mm.

In some embodiments of the present disclosure, the mixing may provide to the first solid mixture a specific grinding energy between about 0.001 kWhr/kg and about 1.0 kWhr/kg. In some embodiments of the present disclosure, the method may further include after the mixing, adding a solvent to the second solid mixture to produce a liquid mixture. In some embodiments of the present disclosure, the liquid solvent may include dimethylformamide. In some embodiments of the present disclosure, the method may further include after the adding, storing the liquid mixture for a period of time. In some embodiments of the present disclosure, the period of time may be between about 12 hours and about six months. In some embodiments of the present disclosure, after the storing of the liquid mixture, the liquid mixture may be substantially free of dimethylammonium formate (DMAF). In some embodiments of the present disclosure, after the storing of the liquid mixture, the liquid mixture is substantially free of dimethylammonium formate (DMAF). In some embodiments of the present disclosure, the method may further include after the storing of the liquid mixture, coating a substrate with the liquid mixture to produce a liquid film of the liquid mixture on the substrate, and treating the substrate and the liquid layer to produce a solid film that includes the perovskite.

BRIEF DESCRIPTION OF THE DRAWINGS

Some embodiments of the present disclosure are illustrated in the referenced figures of the drawings. It is intended that the embodiments and figures disclosed herein are to be considered illustrative rather than limiting.

Figure 1A:
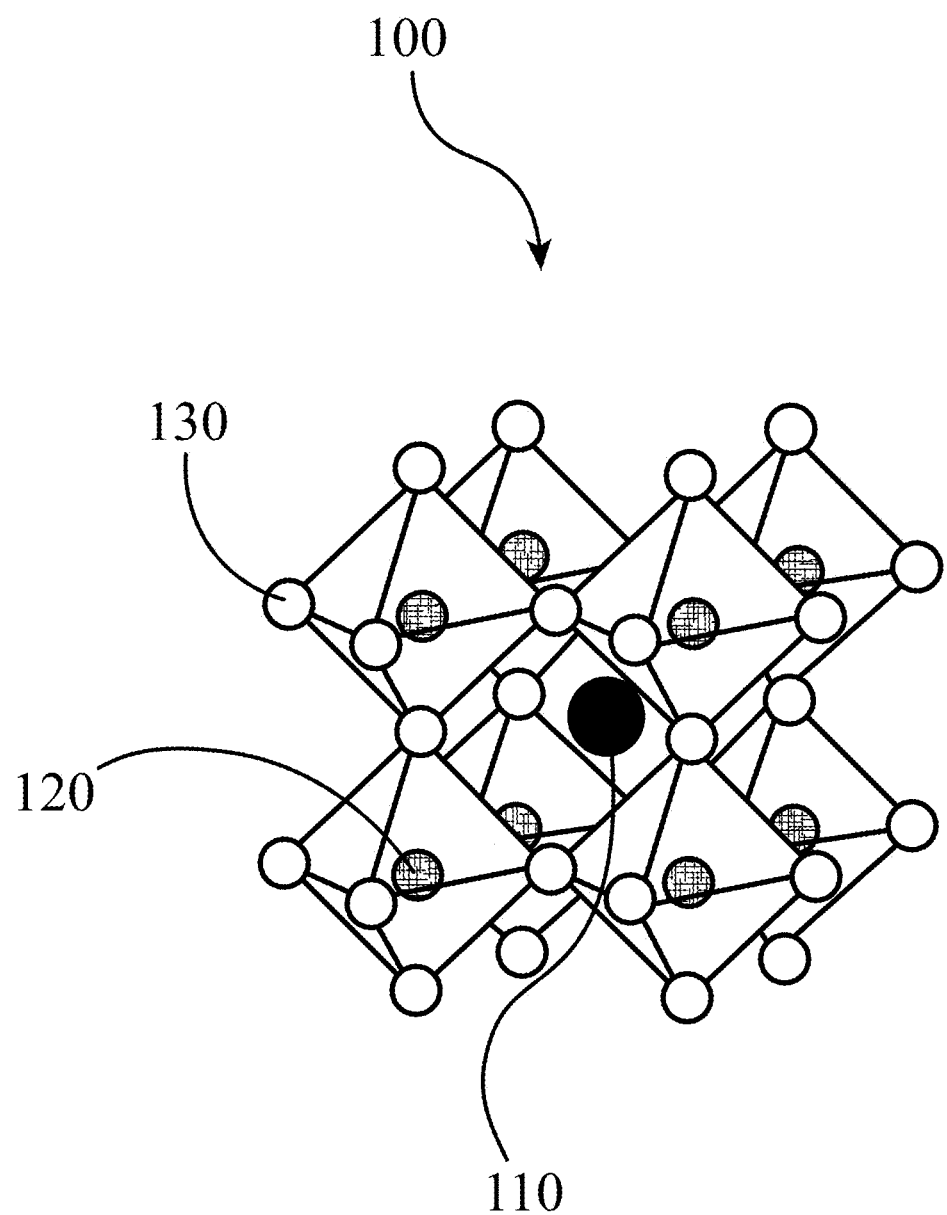
FIGS. 1A, 1B, and 1C illustrate a three-dimensional (3D) perovskite, according to some embodiments of the present disclosure.

| | |
|---|---|
| 100 | metal halide perovskite |
| 110 | A-cation |
| 120 | B-cation |
| 130 | X-anion |
| 200 | method/process/system |
| 205 | starting material |
| 210 | metering |
| 220 | combining and/or storing |
| 230 | intermediate mixture |
| 240 | mixing |
| 250 | final mixture |

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

Figure 1B:
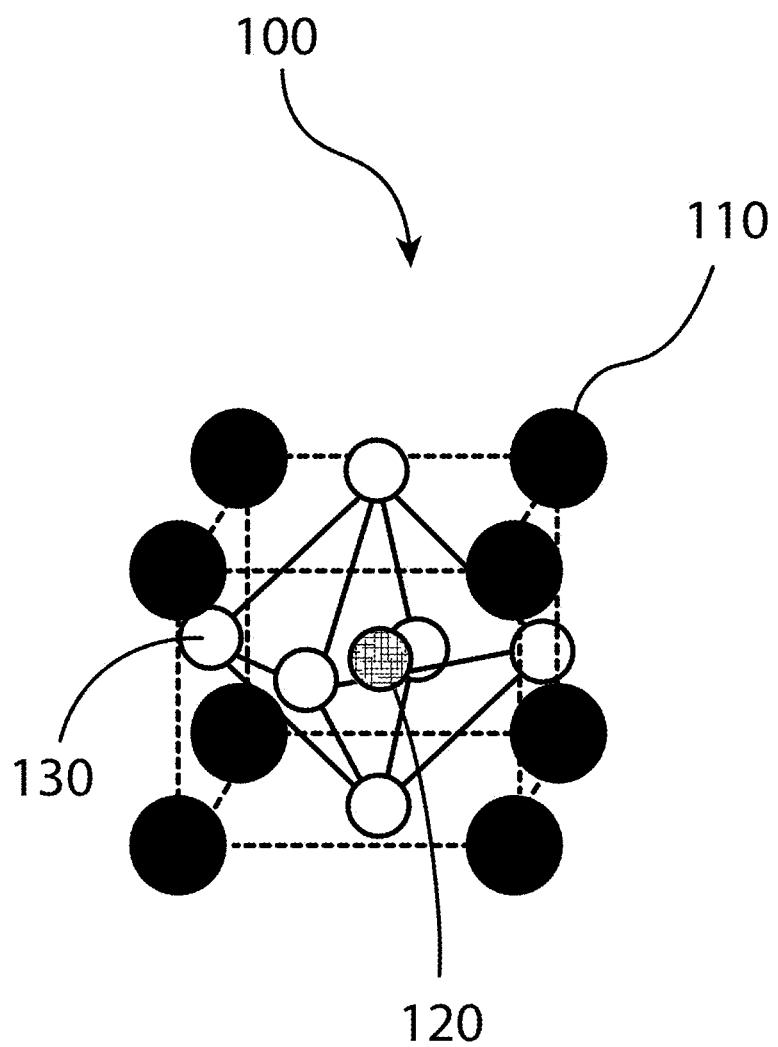
Figure 1C:
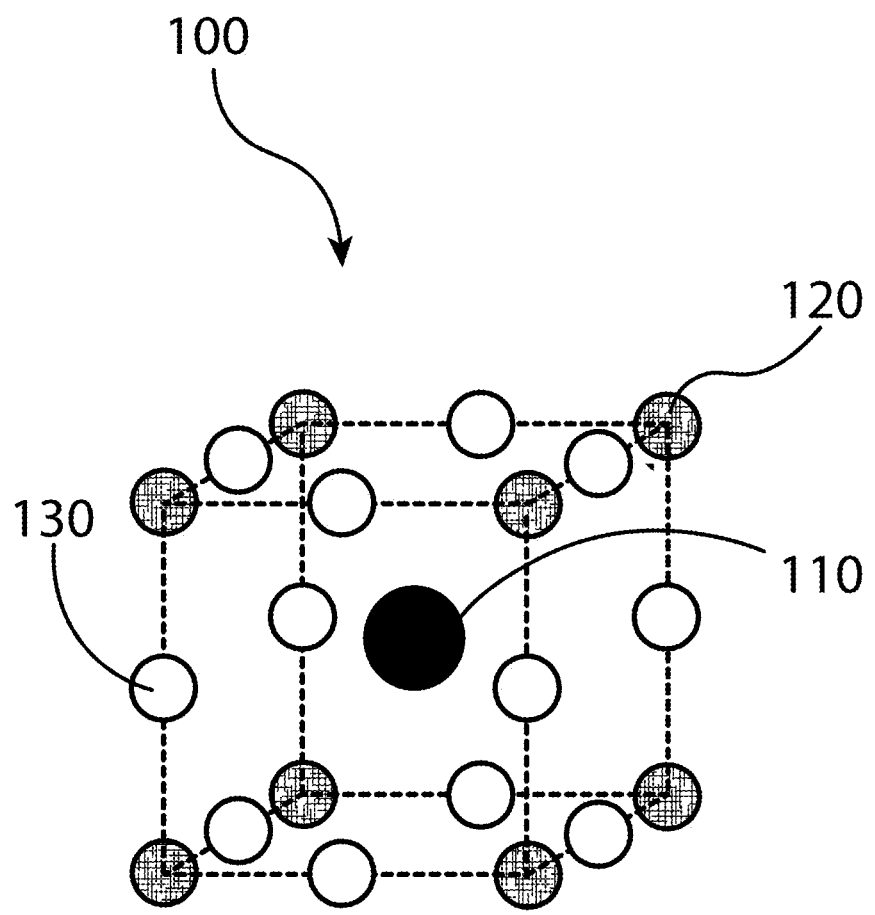

FIGS. 1A, 1B, and 1C illustrate that perovskites 100, for example halide perovskites, may organize into cubic crystalline structures with corner-sharing octahedra, as well as other crystalline structures such as tetragonal, hexagonal, and orthorhombic with either edge- or face-sharing octahedra, and may be described by the general formula $ABX_3$, where X (130) is an anion and A (110) and B (120) are cations, typically of different sizes (A typically larger than B). FIG. 1A illustrates that a perovskite 100 may be organized into eight octahedra surrounding a central A-cation 110, where each octahedra is formed by six anions 130 surrounding a central B-cation 120. FIG. 1B illustrates that a perovskite 100 may be visualized as a cubic unit cell, where the B-cation 120 is positioned at the center of the cube, an A-cation 110 is positioned at each corner of the cube, and an anion 130 is face-centered on each face of the cube. FIG. 1C illustrates that a perovskite 100 may also be visualized as a cubic unit cell, where the B-cation 120 resides at the eight corners of a cube, while the A-cation 110 is located at the center of the cube and with 12 anions 130 centrally located between B-cations 120 along each edge of the unit cell. For both unit cells illustrated in FIGS. 1B and 1C, the A-cations 110, the B-cations 120, and the anions 130 balance to the general formula $ABX_3$, after accounting for the fractions of each atom shared with neighboring unit cells. For example, referring to FIG. 1B, the single B-cation 120 atom is not shared with any of the neighboring unit cells. However, each of the six anions 130 is shared between two unit cells, and each of the eight A-cations 110 is shared between eight unit cells. So for the unit cell shown in FIG. 1B, the stoichiometry simplifies to B=1, A=8*0.124=1, and X=6*0.5=3, or $ABX_3$. Similarly, referring again to FIG. 1C, since the A-cation is centrally positioned, it is not shared with any of the unit cells neighbors. However, each of the 12 anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to FIG. 1C, the anions 130 and the B-cations 120 are shown as aligned along an axis; e.g. where the angle at the anion 130 between two neighboring B-cations 120 is exactly 180 degrees, referred to herein as the tilt angle. However, a perovskite 100 may have a tilt angle not equal to 180 degrees. For example, some embodiments of the present disclosure may have a tilt angle between 153 and 180 degrees.

Typical inorganic perovskites include calcium titanium oxide (calcium titanate) minerals such as, for example, CaTiO3 and SrTiO3. In some embodiments of the present invention, the A-cation 110 may include a nitrogen-containing organic compound such as an alkyl ammonium compound. The B-cation 120 may include a metal and the anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a C1-20 alkyl ammonium cation, a C1-6 alkyl ammonium cation, a C2-6 alkyl ammonium cation, a C1-5 alkyl ammonium cation, a C1-4 alkyl ammonium cation, a C1-3 alkyl ammonium cation, a C1-2 alkyl ammonium cation, and/or a C1 alkyl ammonium cation. Further examples of organic A-cations 110 include methylammonium (CH3NH3+), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), hydrazinium, acetylammonium, dimethylammonium, imidazolium, guanidinium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium. Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl (C1), ethyl (C2), n-propyl (C3), isopropyl (C3), n-butyl (C4), tert-butyl (C4), sec-butyl (C4), iso-butyl (C4), n-pentyl (C5), 3-pentanyl (C5), amyl (C5), neopentyl (C5), 3-methyl-2-butanyl (C5), tertiary amyl (C5), and n-hexyl (C6). Additional examples of alkyl groups include n-heptyl (C7), n-octyl (C8) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for anions 130 include halogens: e.g. fluorine, chlorine, bromine, iodine and/or astatine. In some cases, the perovskite halide may include more than one anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cations 120, and anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g. x is not equal to 1, 2, or 3. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the anion 130 of a perovskite 100 may include one or more anions, for example, one or more halogens. Any combination is possible provided that the charges balance.

For example, a perovskite having the basic crystal structure illustrated in FIG. 1A, in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Figure 1D:
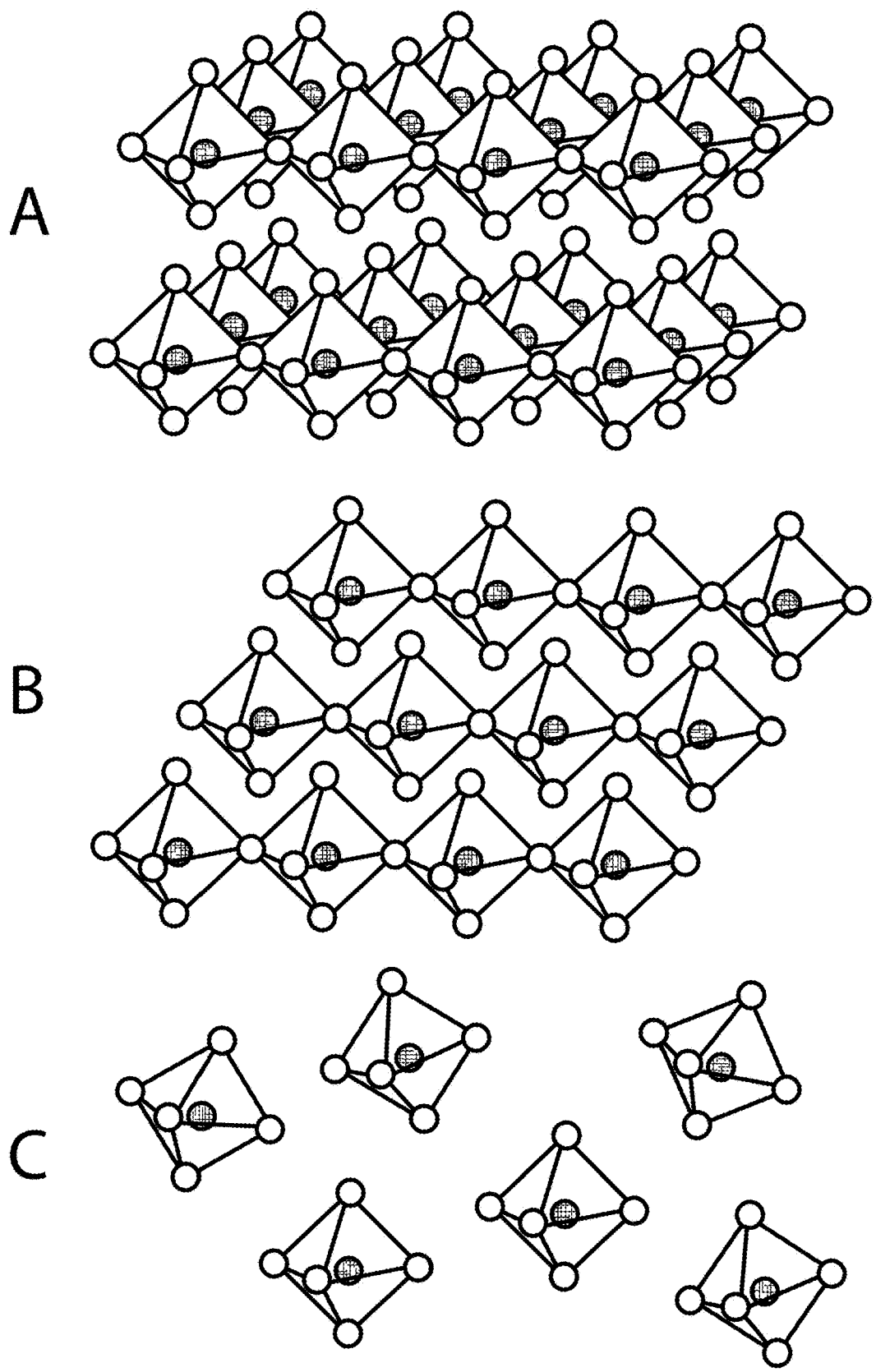
FIG. 1D, Panels A, B, and C illustrate a two-dimensional (2D) perovskite, a one-dimensional (1D) perovskite, and a zero-dimensional (0D) perovskite, respectively, according to some embodiments of the present disclosure.

In addition, perovskite halides, like other organic-inorganic perovskites, can form a three-dimensional (3D) network, a two-dimensional (2D) network, a one-dimensional (1D) network and/or a zero-dimensional (0D) network, possessing the same unit structure. A perovskite's 3D network is illustrated in FIGS. 1A, 1B, and 1C. FIG. 1D illustrates a 2D perovskite network, a 1D perovskite network, and a 0D perovskite network, in Panels A, B, and C, respectively. As described above, a 3D perovskite may adopt a general chemical formula of $ABX_3$, in which the A-cation may be a monovalent cation (e.g. methylammonium and/or formamidinium $CH(NH_2)_2^+$), the B-cation may be a divalent cation (e.g. $Pb^{2+}$ and/or $Sn^{2+}$), and the anion may be a halide anion ($I^-$, $Br^-$, and/or $Cl^-$). In this formula, the 3D network of perovskites may be constructed by linking all corner sharing $BX_6$ octahedra, with the A-cation filling the space between eight octahedral unit cells to balance the crystal charge.

Referring to Panel A of FIG. 1D, through the chemically accomplished dimensional reduction of the 3D crystal lattice, 2D perovskites, $(A')_m(A)_{n-1}B_nX_{3n+1}$, may adopt a new structural and compositional dimension, A' (not shown), where monovalent (m=2) or divalent (m=1) cations can intercalate between the anions of the 2D perovskite sheets. Referring to Panel B of FIG. 1D, 1D perovskites are constructed by $BX_6$ octahedral chained segments spatially isolated from each other by surrounding bulky organic cations (not shown), leading to bulk assemblies of paralleled octahedral chains. Referring to Panel C of FIG. 1D, typically, 0D perovskites consist of isolated inorganic octahedral clusters and surrounded by small cations (not shown) which are connected via hydrogen bonding and/or other ionic interactions.

Figure 2:
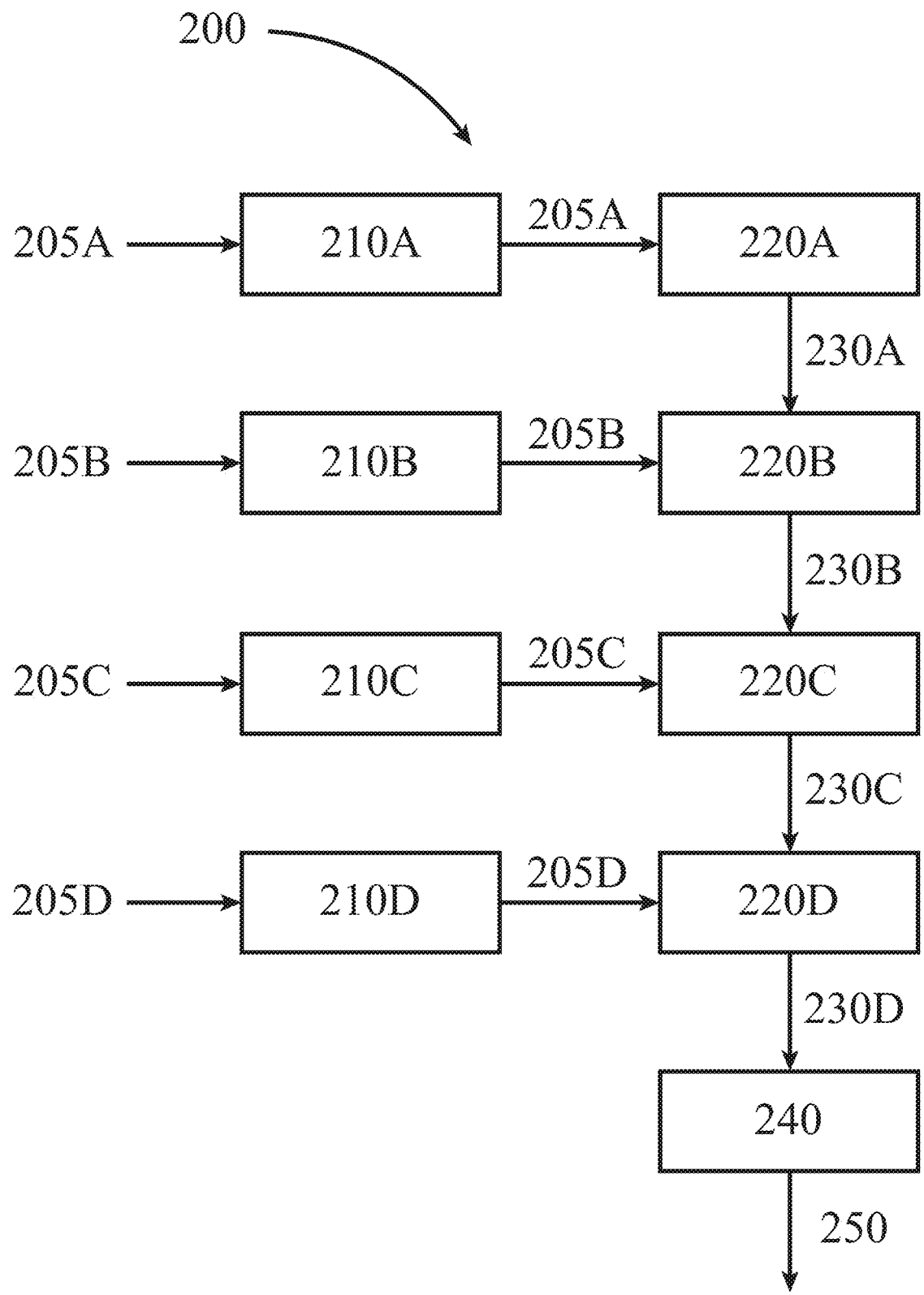
FIG. 2 illustrates a method for producing stable mixtures that may be used to reliably produce stable perovskite materials, according to some embodiments of the present disclosure.

FIG. 2 illustrates a method/process/system 200 that may be utilized to reliably produce stable mixtures of perovskite precursors and/or stable metal halide perovskites, according to some embodiments of the present disclosure; e.g. solid containing metal halide perovskite crystals. In some embodiments, such a method/process/system 200 may be utilized to produce one or more mixtures of perovskite precursor materials that enable their long term storage without degradation of their physical properties, or in the physical properties of the final perovskite materials produced using the perovskite precursor mixtures, for example in final solution phase processing of the perovskite precursor mixtures; e.g. using blade-coating, dip-coating, and/or any other suitable solution processing unit operations.

In this example, the method/process/system 200 begins with one or more metering steps (210A, 210B, 210C, and 210D) of one or more starting materials (205A, 205B, 205C, and 205D), e.g. perovskite precursor materials such as $PbI_2$, MAX, FAX, CsX, etc. (where X is a halogen), need to achieve a desired perovskite formulation to produce of specific target perovskite crystal, e.g. $ABX_3$. As used herein, the term "metering" refers the measuring of a precise volume and/or mass of a target material, e.g. liquid, solid, and/or gas onto a surface (e.g. a weigh scale) and/or into a volume (e.g. a storage vessel). The example of FIG. 2 illustrates four metering steps (210A, 210B, 210C, and 210D) of four starting materials 205, e.g. perovskite precursors, (205A, 205B, 205C, and 205D) into the system/process/method 200. Each metering step 210 may be followed by a combining/storing 220 of the starting material 205 being metered and resulting in the formation of an intermediate mixture 230. For exemplary purposes only, a method/process/system 200 may include a first metering 210A of a first starting material 205A, e.g. $PbI_2$, onto a weigh scale until a target weight is attained. The weighed mass of the $PbI_2$ may then be subsequently transferred to a storage vessel (not shown). In some embodiments of the present disclosure, a first starting material 205A may be metered accurately volumetrically using a rotating screw to transfer, for example, $PbI_2$, directly into a storage container. Of course, the first starting material 205A may be either essentially a single pure material, e.g. $PbI_2$, or it may be a mixture of two or more components. The metered first raw material 205A may be directed to a first combining and/or storing 220A step, accomplished for example in a storage vessel (e.g. silo), on a weigh scale, on a conveyer belt, in a pipe, etc., resulting in a first intermediate mixture 230A. For the example where the first starting material 205A is the first raw material to enter the process, the first intermediate mixture 230A will be essentially pure first starting material 205A.

Referring again to FIG. 2, the exemplary method/process/system 200 may proceed with a second metering 210B of a second starting material 205B. The metered second starting material 205B, like the first starting material 205A, may be metered accurately using at least one of a gravimetric metering system and/or a volumetric metering system. Once metered, the second starting material 205B may be stored in a separate storage container/area and/or combined with the first intermediate mixture 230A in a second combining/storing 220B step to produce a second intermediate mixture 230B. For the example of FIG. 2, the first intermediate mixture 230A (e.g. $PbI_2$) may be metered into a storage silo for storage for a period of time (e.g. from seconds to days, or even months). In some embodiments of the present disclosure, the second starting material 205B, (e.g. FABr) may be measured by metering the second starting material 205B onto a weigh scale, until a target amount of the second starting material 205B is attained. This weighed amount of the second starting material 205B may then be dropped gravimetrically into the storage silo already containing the first intermediate mixture 230A, resulting in the formation of a second intermediate mixture 230B, e.g. of $PbI_2$ and FABr. Alternatively (or in addition to), the weighed amount of the second starting material 205B (e.g. FABr) may be transferred to the storage silo pneumatically and/or mechanically conveyed (e.g. by conveyor belt) resulting in the formation of the second intermediate mixture 230B, e.g. of $PbI_2$ and FABr. In some embodiments of the present disclosure, the second starting material 205B may be accurately metered volumetrically, e.g. using an extruder, into its own storage area for subsequent combining with the other upstream starting materials, or the second starting material 205B may be added to the other starting materials in a second storing/combining 220B, e.g. performed in a storage silo, resulting in the forming the second intermediate mixture 230B; e.g. $PbI_2$ and FABr.

Referring again to FIG. 2, the exemplary method/process/system 200 may proceed with a third metering 210C of a third starting material 205C. The metered third starting material 205C, like the first and second starting materials (205A and 205B), may be metered accurately using at least one of a gravimetric metering system and/or a volumetric metering system. Once metered, the third starting material 205C may be stored in a separate storage container/area and/or combined with the second intermediate mixture 230B in a third combining/storing 220C step to produce a third intermediate mixture 230C. For the example of FIG. 2, the second intermediate mixture 230B (e.g. $PbI_2$ and FABr) may be metered into a storage silo for storage for a period of time (e.g. from seconds to days, or even months). In some embodiments of the present disclosure, the third starting material 205C, (e.g. CsI) may be measured by metering the third starting material 205C onto a weigh scale, until a target amount of the third starting material 205C is attained. This weighed amount of the third starting material 205C may then be dropped gravimetrically into the storage silo already containing the second intermediate mixture 230B, resulting in the formation of a third intermediate mixture 230C, e.g. of $PbI_2$, FABr, and CsI. Alternatively (or in addition to), the weighed amount of the third starting material 205C (e.g. CsI) may be transferred to the storage silo pneumatically and/or mechanically conveyed (e.g. by conveyor belt) resulting in the formation of the third intermediate mixture 230C, e.g. of $PbI_2$, FABr, and CsI. In some embodiments of the present disclosure, the third starting material 205C may be accurately metered volumetrically, e.g. using an extruder, into its own storage area for subsequent combining with the other upstream starting materials, or the third starting material 205C may be added to the other starting materials in a third storing/combining 220C, e.g. performed in a storage silo, resulting in the forming the third intermediate mixture 230C; e.g. $PbI_2$, FABr, and Cs.

Referring again to FIG. 2, the exemplary method/process/system 200 may proceed with a fourth metering 210D of a fourth starting material 205D. The metered fourth starting material 205D, like the first, second, and third starting materials (205A, 205B, and 205C), may be metered accurately using at least one of a gravimetric metering system and/or a volumetric metering system. Once metered, the fourth starting material 205D may be stored in a separate storage container/area and/or combined with the third intermediate mixture 230C in a fourth combining/storing 220D step to produce a fourth intermediate mixture 230D. For the example of FIG. 2, the third intermediate mixture 230C (e.g. $PbI_2$, FABr, and CsI) may be metered into a storage silo for storage for a period of time (e.g. from seconds to days, or even months). In some embodiments of the present disclosure, the fourth starting material 205D, (e.g. MACl) may be measured by metering the fourth starting material 205D onto a weigh scale, until a target amount of the fourth starting material 205D is attained. This weighed amount of the fourth starting material 205D may then be dropped gravimetrically into the storage silo already containing the third intermediate mixture 230C, resulting in the formation of a fourth intermediate mixture 230D, e.g. of $PbI_2$, FABr, CsI, and MACl. Alternatively (or in addition to), the weighed amount of the fourth starting material 205D (e.g. MACl) may be transferred to the storage silo pneumatically and/or mechanically conveyed (e.g. by conveyor belt) resulting in the formation of the fourth intermediate mixture 230D, e.g. of $PbI_2$, FABr, CsI, and MACl. In some embodiments of the present disclosure, the fourth starting material 205D may be accurately metered volumetrically, e.g. using an extruder, into its own storage area for subsequent combining with the other upstream starting materials, or the fourth starting material 205D may be added to the other starting materials in a fourth storing/combining 220D, e.g. performed in a storage silo, resulting in the forming the fourth intermediate mixture 230D; e.g. $PbI_2$, FABr, Cs, and MACl.

Referring again to FIG. 2, this exemplary method/process/system 200 shows the use of four starting materials 205, four metering steps 210, four combining steps 220, to produce for intermediate mixtures 230. However, in some embodiments of the present disclosure, fewer or more starting materials 205, metering steps 210, and/or combining steps 220 may be utilized to produce fewer or more than four intermediate mixtures 230, depending on the complexity of perovskite formulation being used. Also, metering steps need not occur in series, and in some embodiments of the present disclosure, two or more metering steps may be completed in a substantially parallel manner. In some embodiments of the present disclosure, at least one of metering, combining, and/or storing may be accomplished within a single step. For example, multiple starting materials 205 may be metered, each using its own dedicated positive displacement pump (e.g. extruder), directly into a single storage vessel, such that the combining/storing step 220 is accomplished in a single vessel. Thus, the number of combinations of metering steps 210 and storing/combining steps 220, and resultant intermediate mixtures 230 are endless, as are the number of combinations of unit operations (e.g. silos, weigh stations, conveyors, positive displacement pumps, etc.). Both methods and systems may be optimized and tailored according to the specific perovskite formulations of interest and according to the corresponding process needs.

Ultimately, the starting materials, e.g. solid salts, however many needed to synthesize a particular target perovskite (i.e. a specific perovskite stoichiometry as defined by $ABX_3$ for a 3D perovskite) may be combined to form a mixture of the starting materials. When more than one starting material 205 is metered in series, one or more intermediate mixtures 230 may be formed. Thus, a large number of mixtures, containing one or more of the starting materials, may be envisioned. In some embodiments of the present disclosure, two or more solid starting materials may be metered and/or combined into one or more solid "master batches", which may be stored for extended periods of time, until the "master batches" are needed for final processing to produce a targeted device, e.g. solar cell, containing the final targeted perovskite material resulting from the combining of the various starting materials, perovskite precursors. Depending on how these master batches are mixed, they may result in a mixture that is simply a mixture of the individual starting materials, e.g. $PbI_2$, MAX, FAX, and/or any other material needed to produce a perovskite as described above. However, in some embodiments of the present disclosure, as described in more detail below, when the mixing is sufficient, the starting materials may be converted to a solid containing perovskite material in crystalline form, e.g. at least one of 3D perovskites, 2D perovskites, 1D perovskites, and/or 0D perovskites as described above.

Thus, any or all of these intermediate mixture (230A-D), including one or more "master batches" of one or more of the starting materials (205A-D) may be physically mixed in a mixing step 240, where the mixing 240 converts the one or more starting materials (205A-D), as an intermediate mixtures (e.g. 230A-D), to a final mixture 250 where at least a portion of the final mixture 250 contains the targeted perovskite in a solid, crystalline form. Although, FIG. 2 illustrates only one mixing step 240, more than one mixing step falls within the scope of the present disclosure. In some embodiments of the present disclosure at least one of a metering step 210, a combining/storing step 220, and/or a mixing step 240 may be combined into a single step, such that the combined step may convert at least a portion of the starting materials 205 to the final targeted perovskite crystal. In some embodiments of the present disclosure, a storage vessel may include the components needed to provide mechanical mixing of the starting materials to convert the starting materials to the targeted perovskite crystals. In some embodiments of the present disclosure, two or more starting materials, e.g. a "master batches" of perovskite precursor salts, may be mechanically mixed using any suitable mechanical mixer. One example of a mechanical mixer is a ball mill. The specific mechanical agitator used will depend on the starting materials' physical properties; e.g. density, hardness, particle size, etc.

Among other things, one objective of the mixing 240, whether it occurs in a separate final step to mixture containing all of the desired perovskite precursor compounds, or in a series of intermediate mixing steps (like in one or more combining/storing 220 steps), is to ensure that the individual starting materials (205A-D) for a are well mixed, such that the final mixture 250 is a solid containing the precursor materials needed to synthesize the targeted perovskite material. Such a final "master batch" mixture 250 containing the targeted perovskite material in the solid form, resulting from the mixing 240, may then be directed to a storage silo and/or to feed silo, which may then be used to meter the "master batch" into the downstream manufacturing process (not shown) that manufactures at least the targeted perovskite material, e.g. a PV device containing a perovskite active layer. For example, a final "master batch" mixture 250, as a simple mixture of the individual starting materials 205, or as a mixture containing perovskite solid crystals, or as a mixture of both perovskite precursors and perovskite crystals, may be added to a solvent for application to a substrate, e.g. spin coating, dip coating, curtain coating, and/or any other suitable solution processing method, followed by a treating (i.e. drying; not shown) step to remove the solvent, resulting in a final solid perovskite film on the substrate. In some embodiments of the present disclosure, treating may be accomplished by heating a film of the solution and/or by exposing it to a dry stream of gas.

In one embodiment of the present disclosure, one or more "master batches" of solid starting materials resulting from a method similar to that shown in FIG. 2 may be combined with a liquid solvent to produce a liquid solution containing the solid perovskite crystals in an at least a partially dissolved state. However, it is understood that various combinations of the elements and features described above may be envisioned, and such embodiments fall within the scope of the present disclosure. For example, solid perovskite materials, made by agitation, that are not reactive with the liquid solvent may be metered, combined, and/or agitated with the liquid solvent to make a liquid "master batch" containing at least partially dissolved non-reactive perovskite crystals, which may be stored for a period of time before final processing (e.g. coating a substrate with the "master batch" followed by annealing) to make a target, solid film of the perovskite. In addition, either in parallel and/or in series, starting materials that are prone to reaction with the liquid solvent may be metered, combined, and/or agitated to form a solid "master batch" of these potentially reactive components. The respective liquid and/or solid "master batches" may then be combined in a downstream combining and/or mixing step, to produce either a solid master batch of perovskite crystals and/or a liquid master batch of perovskite crystals.

The present disclosure relates to, and derives from, the observation of the degradation of metal halide perovskite (MHP) solutions (i.e. inks) based on the most commonly used solvents, dimethylformamide (DMF) and dimethyl sulfoxide (DMSO). For the MHP inks studied herein, which contain formamidinium ($FA^+$), methylammonium ($MA^+$), cesium (CO, lead ($Pb^{2+}$), bromide ($Br^-$) and iodide (P), dramatic compositional changes are observed following storage of the precursor solutions, even when stored in nitrogen and in the dark. It is shown herein that hydrolysis of DMF in the precursor solution forms dimethylammonium formate, which subsequently incorporates into the MHP film. The changes in solution chemistry lead to a modification of the perovskite film stoichiometry, band gap, and structure. Contrary to this, according to some embodiments of the present disclosure, solid precursor salts are stable when combined and/or mixed (e.g. using a ball mill) into a powder, allowing for the storage of large quantities of stoichiometric precursor materials (intermediate mixtures and/or final mixtures), which demonstrates the instabilities of the inks are not a result of chemistry occurring between the perovskite precursor salts, at least while the precursor materials are in solid form.

The shelf life of a $Cs_{0.05}(MA_{0.17}FA_{0.83})_{0.95}Pb(I_{0.83}Br_{0.17})_3$ precursor ink (abbreviated FAMACs) was explored by fabricating a series of MHP films and devices from a large volume of ink, which was stored in the dark in nitrogen. Despite the inert storage conditions, it was determined that trace water leads to hydrolysis of the DMF, producing dimethylammonium formate in solution. Dimethylammonium cations ($DMA^+$) are incorporated into the perovskite films and deleteriously affect the optoelectronic properties of the resultant films and devices, which dramatically change the stoichiometry of the films, reduce the amount of $MA^+$ and $Cs^+$, and result in the formation of the yellowish $FA^+$- and $DMA^+$-based perovskite phases, instead of the black cubic phase of FAMACs. These changes were partially recovered by adding the deficient cations and halides back into the aged ink, evidenced by the improved optoelectronic performance of the films and devices from the modifications. In the end, mixing the precursor salts in the absence of solvent by ball-milling was demonstrated to effectively avert modification of the perovskite films with precursor storage time. As used herein, the term "ink" refers to a liquid solution that includes a liquid solvent and at least one partially dissolved solid starting material (e.g. dissolved perovskite precursor salts).

Figure 3A:
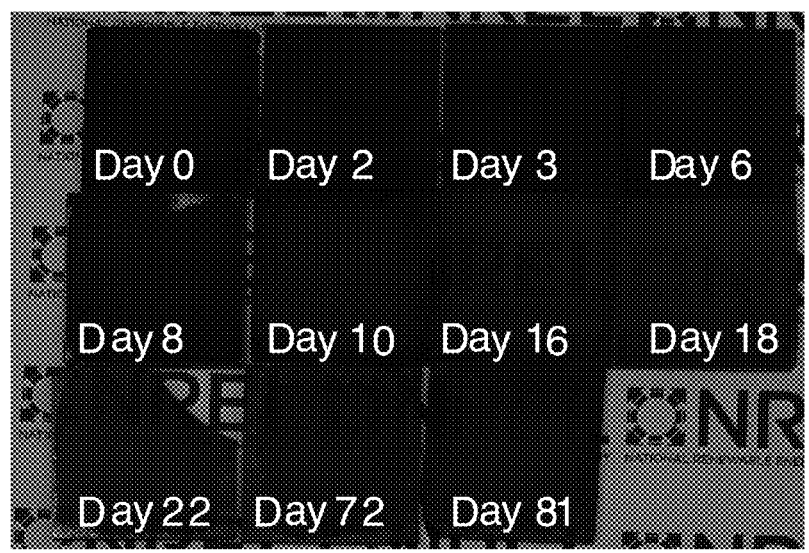
FIG. 3A illustrates photographs of $Cs_{0.05}(MA_{0.17}FA_{0.83})_{0.95}Pb(I_{0.83}Br_{0.17})_3$ (referred to herein as FAMACs where "FA" refers to formamidinium and "MA" refers to methylammonium) films fabricated from FAMACs inks stored for different periods of time in the dark in a $N_2$ environment, according to some embodiments of the present disclosure.
Figure 3B:
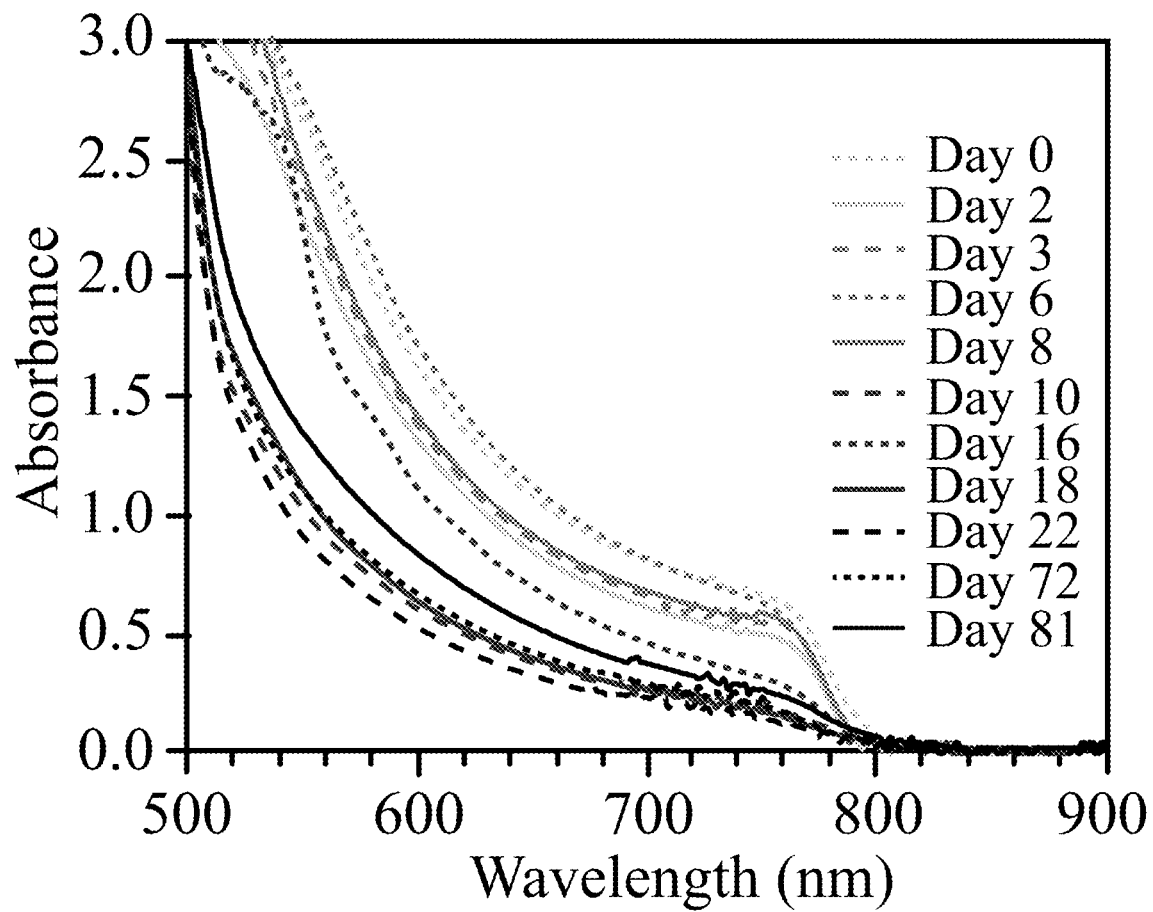
FIG. 3B illustrates absorption spectra of $Cs_{0.05}(MA_{0.17}FA_{0.83})_{0.95}Pb(I_{0.83}Br_{0.17})_3$ perovskite films fabricated from FAMACs inks stored for different periods of time (between 0 and 81 days) in the dark in a $N_2$ environment, according to some embodiments of the present disclosure.
Figure 3C:
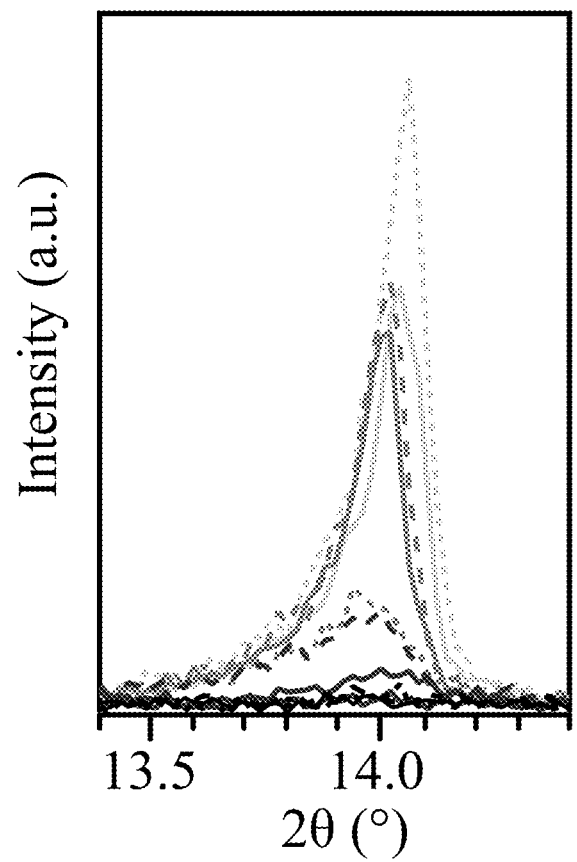
FIGS. 3C and 3D illustrate XRD patterns (not normalized) of $Cs_{0.05}(MA_{0.17}FA_{0.83})_{0.95}Pb(I_{0.83}Br_{0.17})_3$ perovskite films fabricated from FAMACs inks stored for different periods of time in the dark in a $N_2$ nitrogen environment, according to some embodiments of the present disclosure. The line formatting in FIGS. 3C and 3D share the same formatting and legend as shown in FIG. 3B.
Figure 3D:
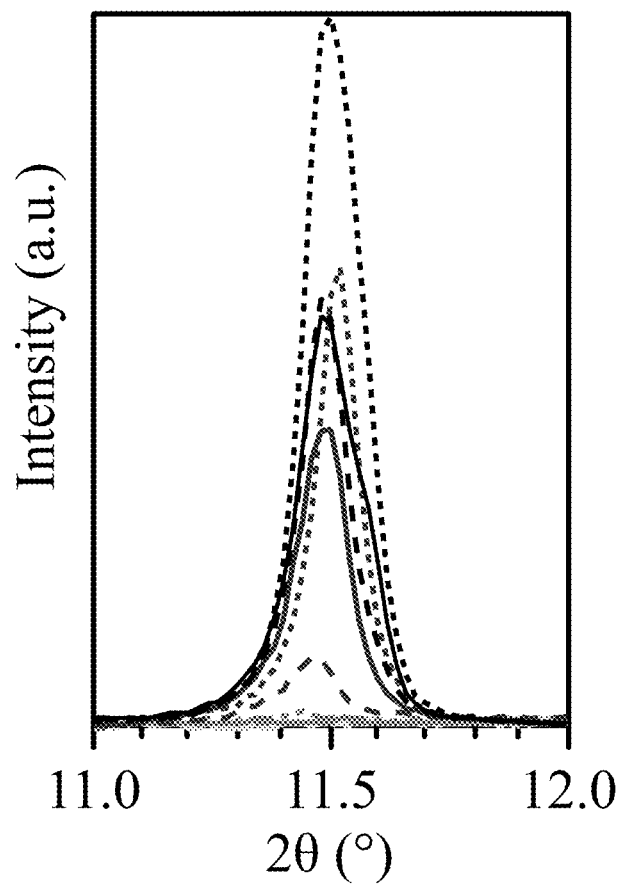
Figure 9:
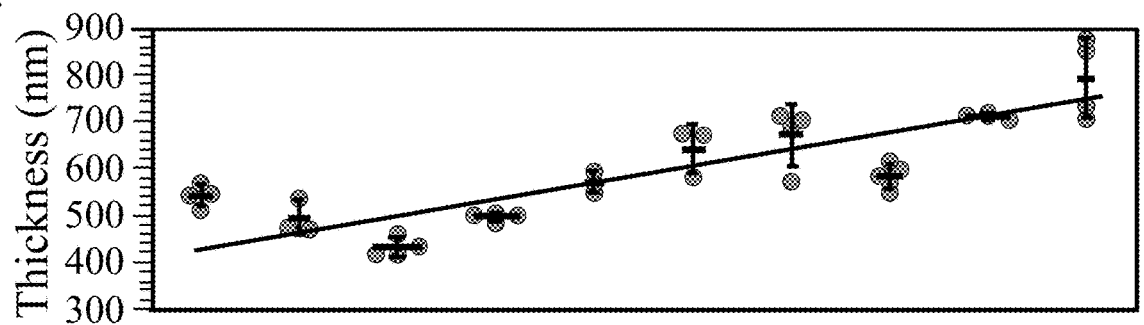
FIG. 9 illustrates the following: (Panel a) thickness and (Panel b) roughness (root mean square over 400 μm) of FAMACs perovskite films fabricated from FAMACs inks that was stored for different periods of time in the dark in a $N_2$ environment. Standard deviation values are indicated. They x-axis numbers indicate the number of days stored.
Figure 9:
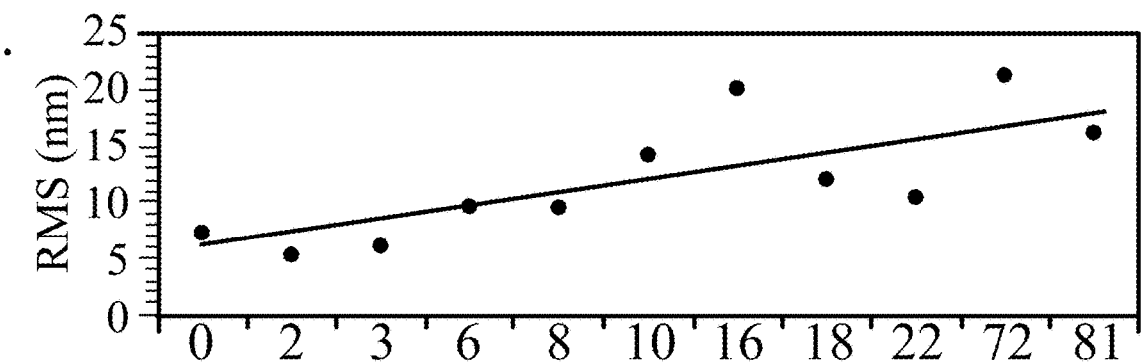
Figure 10:
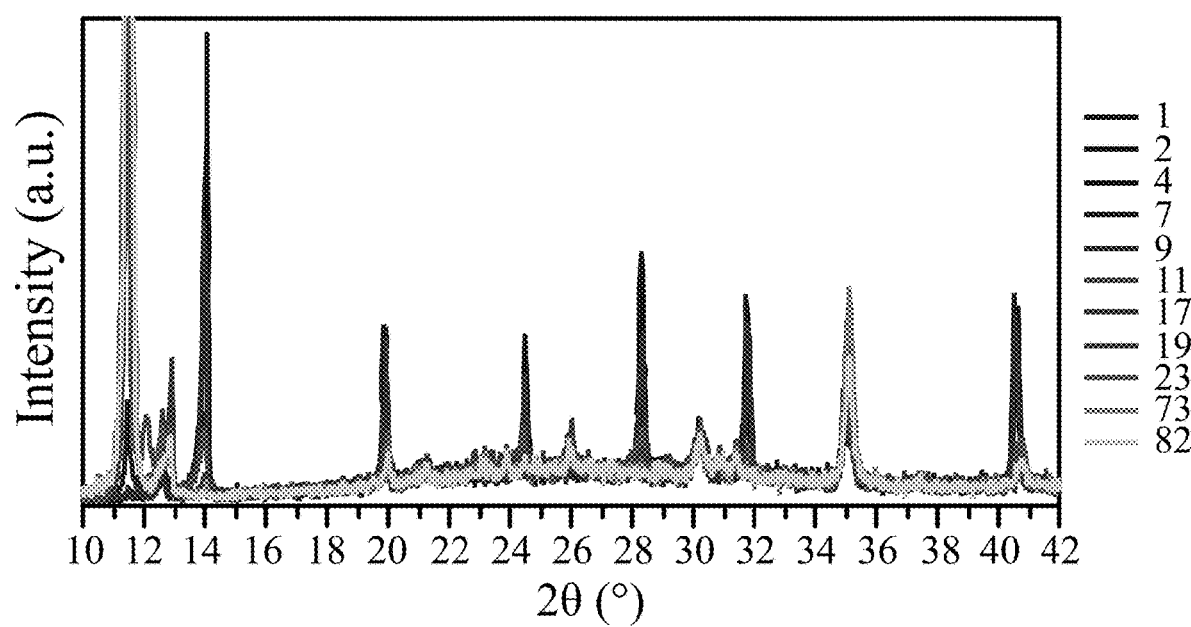
FIG. 10 illustrates XRD patterns of FAMACs perovskite films fabricated from FAMACs inks that were stored for different periods of time in the dark in a $N_2$ nitrogen environment. Legend numbers correspond to days.
Figure 11A:
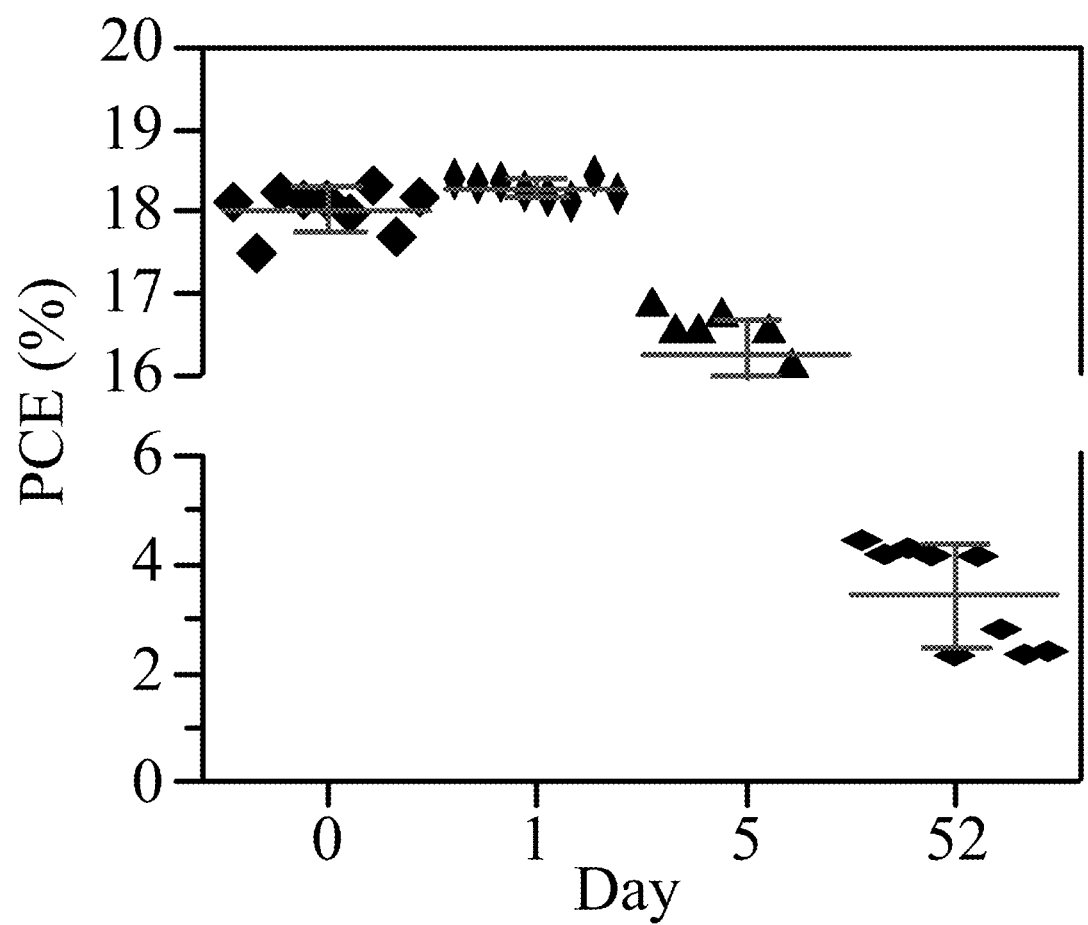
FIG. 11A illustrates the PCE values of FAMACs perovskite-containing devices fabricated with an FAMACs ink stored for different periods of time: fresh ink at day 0, 1 day, 5 days, and 52 days, according to some embodiments of the present disclosure. Lines represents average values and standard deviations.
Figure 11B:
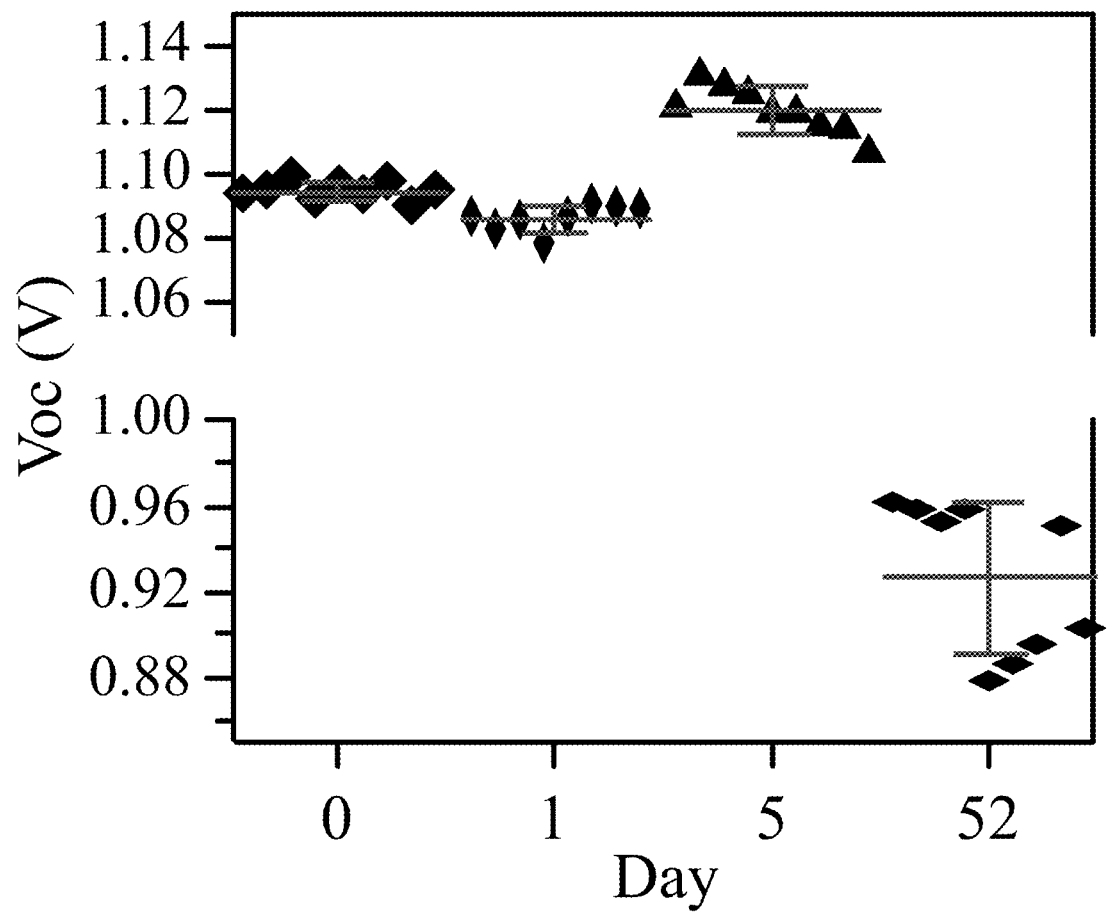
FIG. 11B illustrates the $V_{oc}$ values of the same FAMACs perovskite-containing devices described in FIG. 11A, according to some embodiments of the present disclosure. Lines represents average values and standard deviations.
Figure 11C:
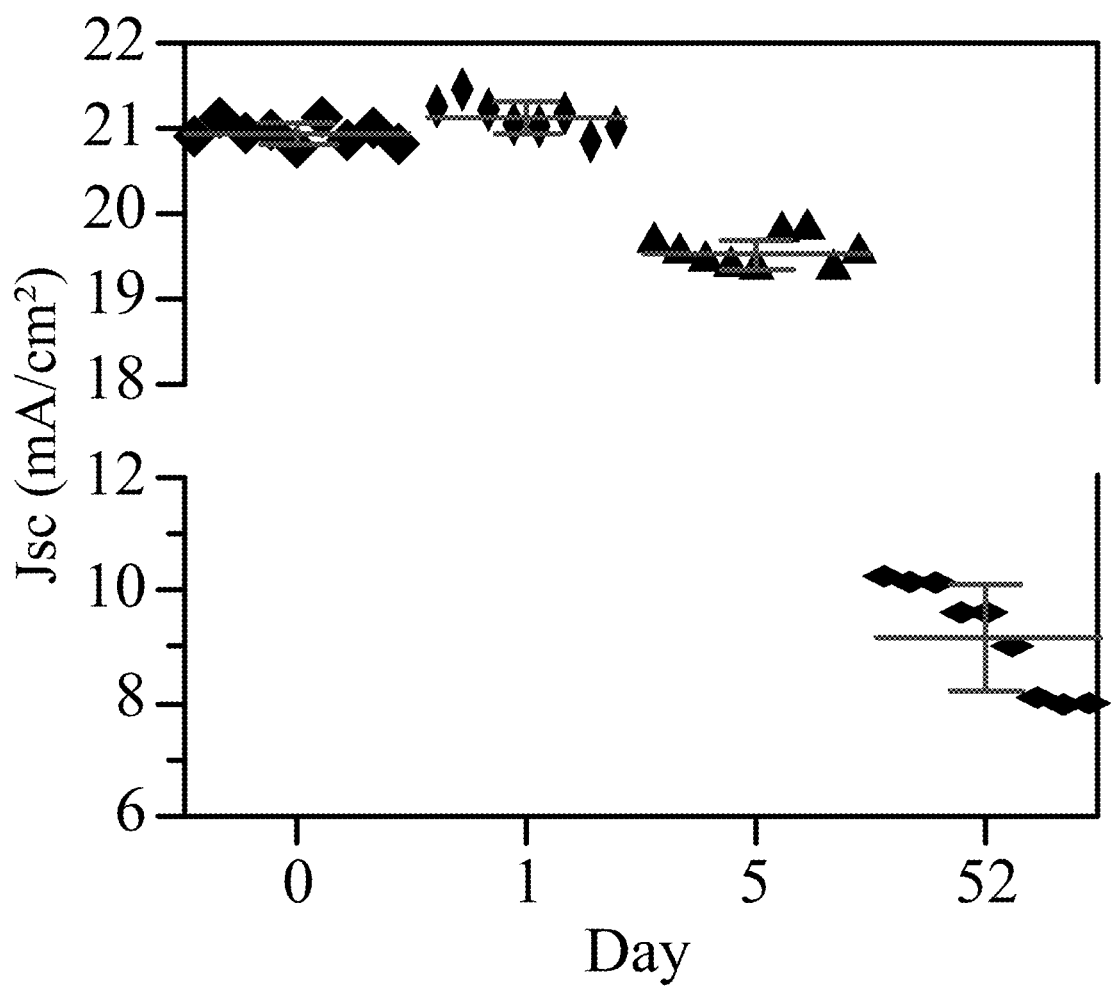
FIG. 11C illustrates the $J_{sc}$ values of the same FAMACs perovskite-containing devices described in FIG. 11A, according to some embodiments of the present disclosure. Lines represents average values and standard deviations.
Figure 11D:
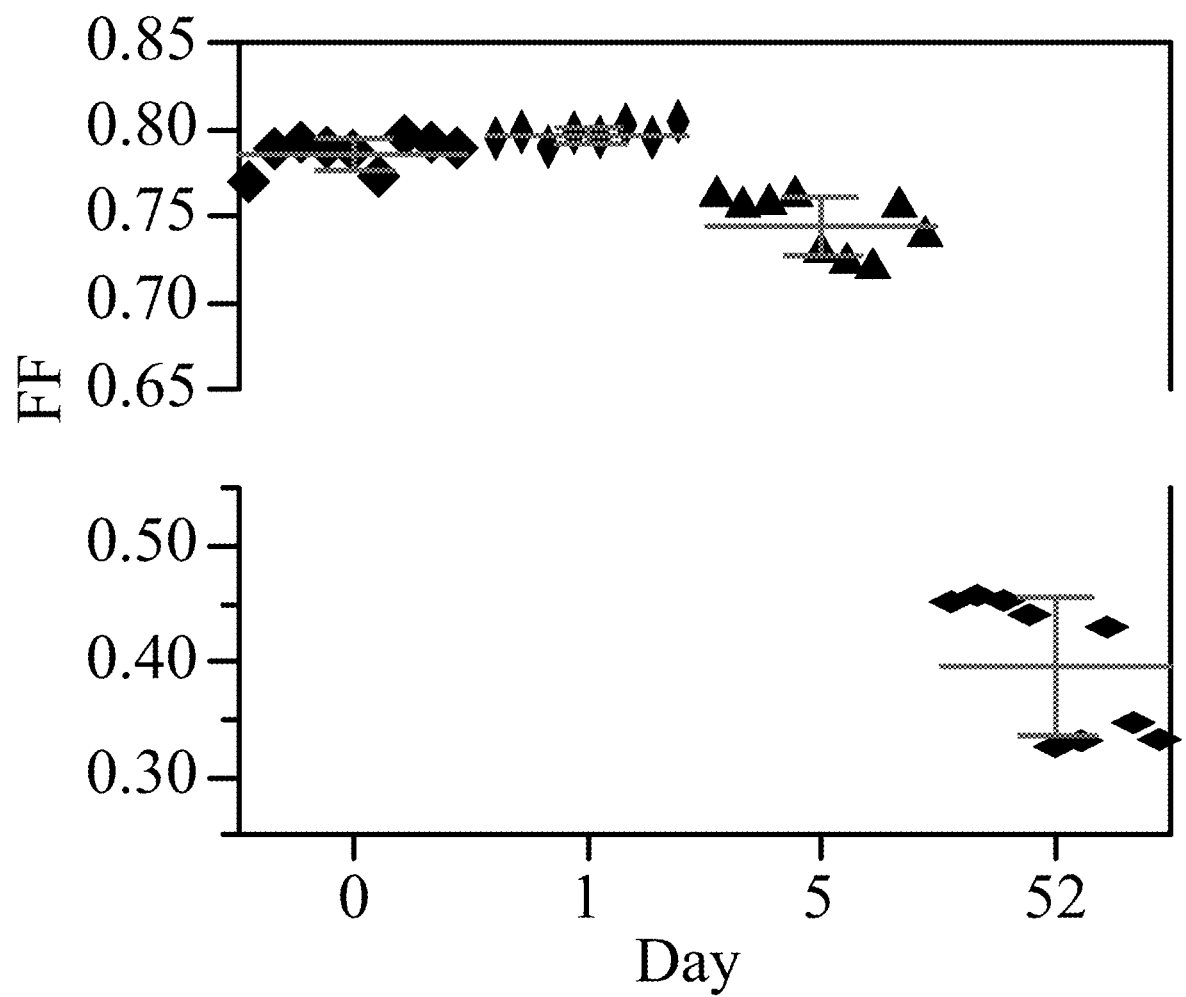
FIG. 11D illustrates the FF values of the same FAMACs perovskite-containing devices described in FIG. 11A, according to some embodiments of the present disclosure. Lines represents average values and standard deviations.
Figure 12A:
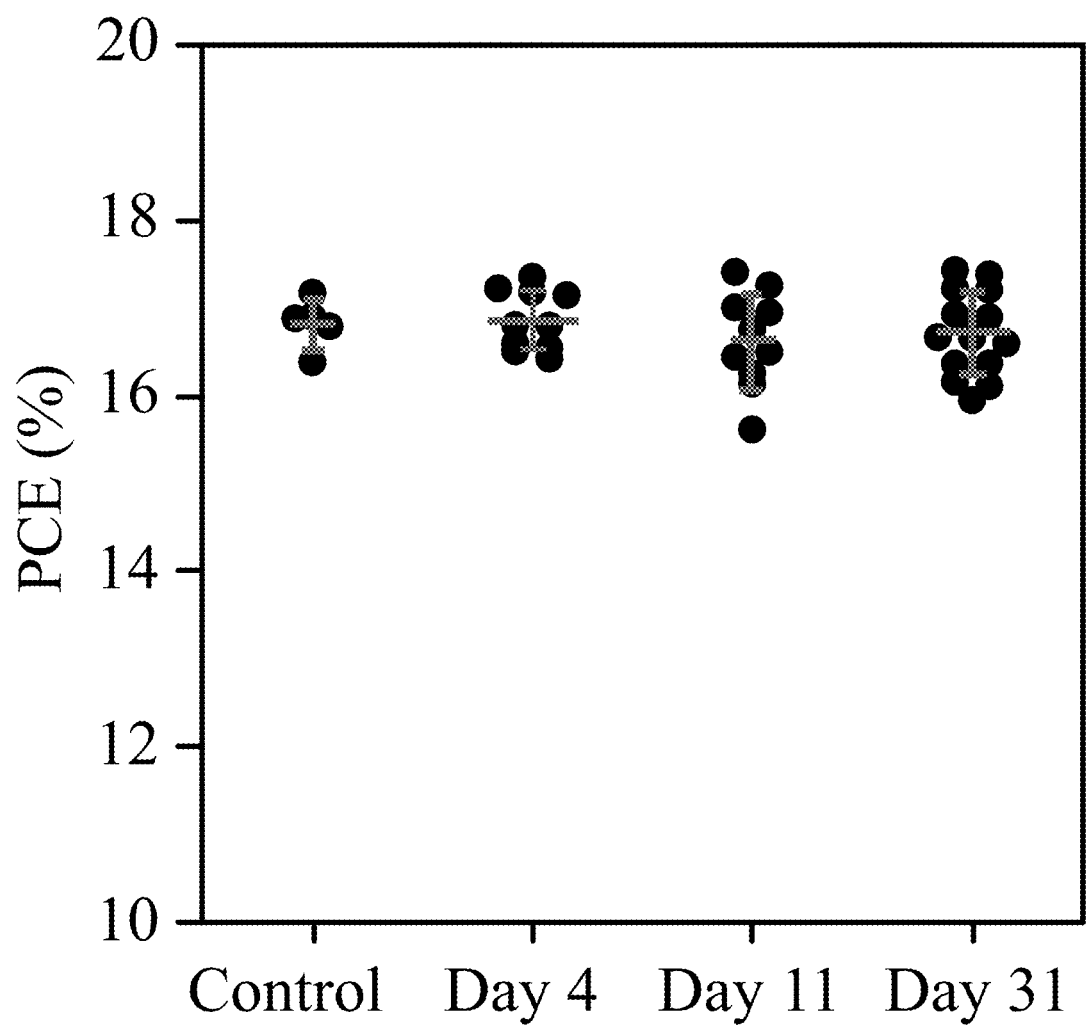
FIG. 12A illustrates the PCE values for FAMACs perovskite-containing devices with FAMACs films made from ball milled salts that were stored for different periods of time, according to some embodiments of the present disclosure.
Figure 12B:
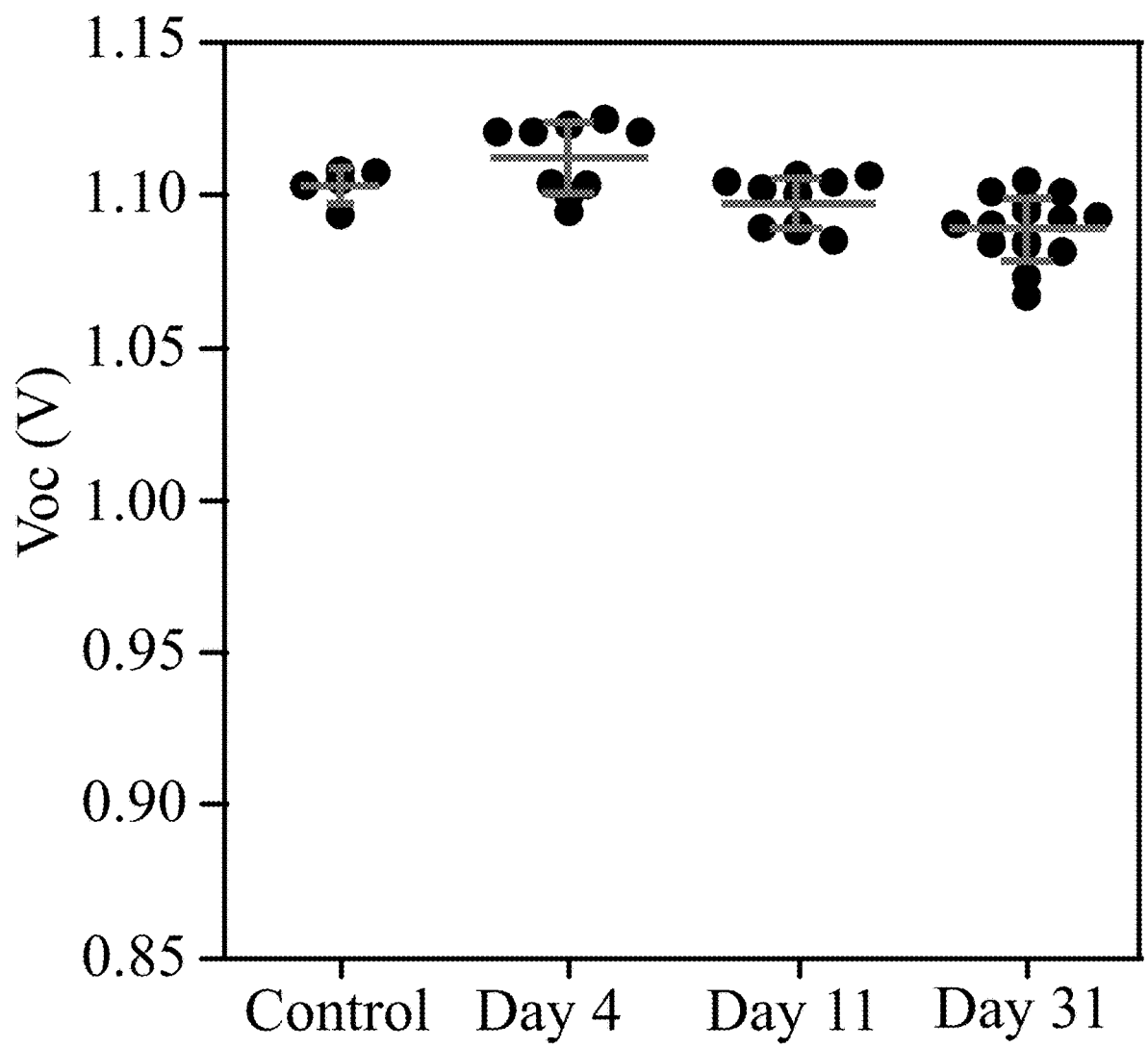
FIG. 12B illustrates the $V_{oc}$ values for the same FAMACs perovskite-containing described in FIG. 12A, according to some embodiments of the present disclosure.
Figure 12C:
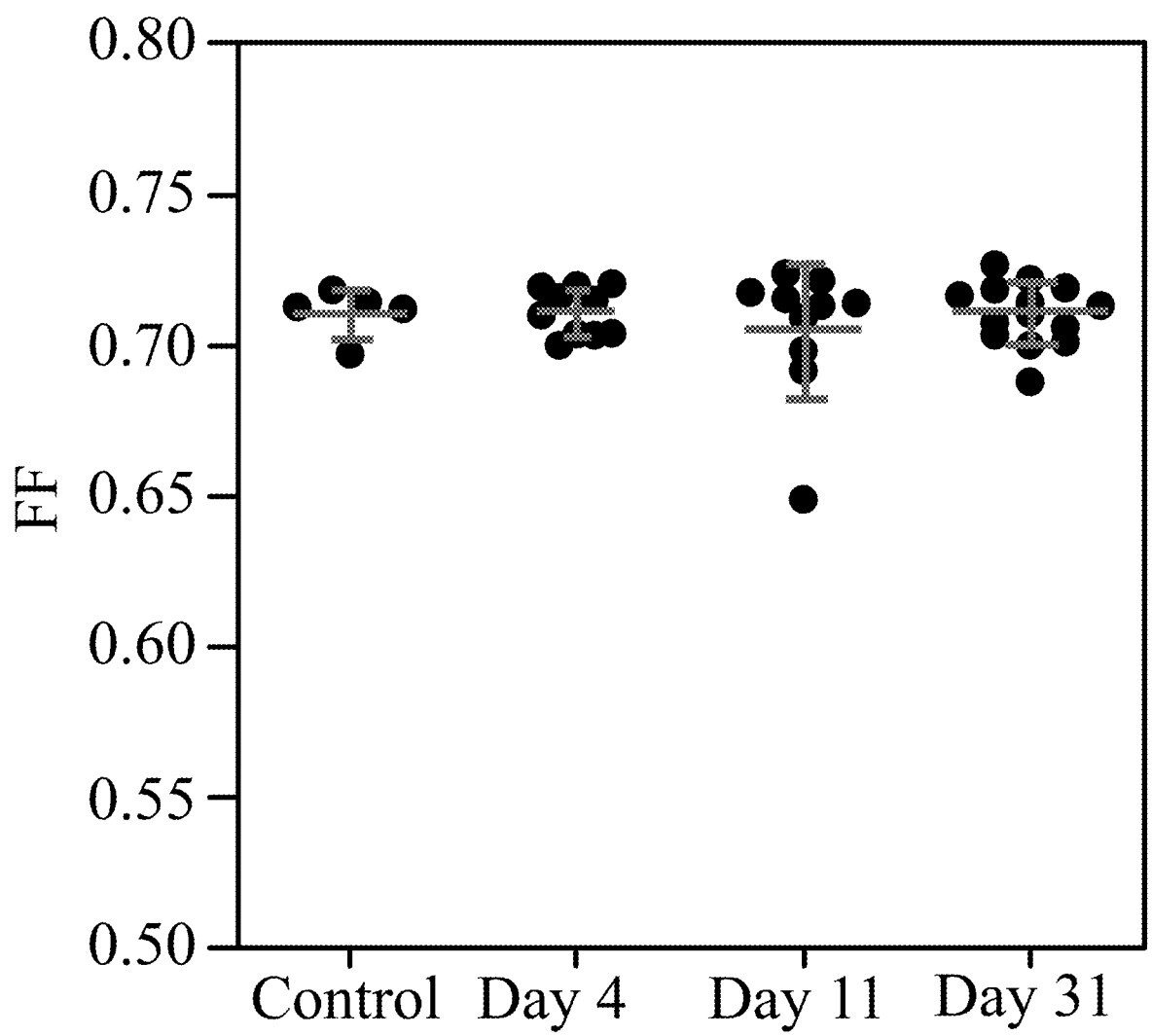
FIG. 12C illustrates the FF values for the same FAMACs perovskite-containing described in FIG. 12A, according to some embodiments of the present disclosure.
Figure 12D:
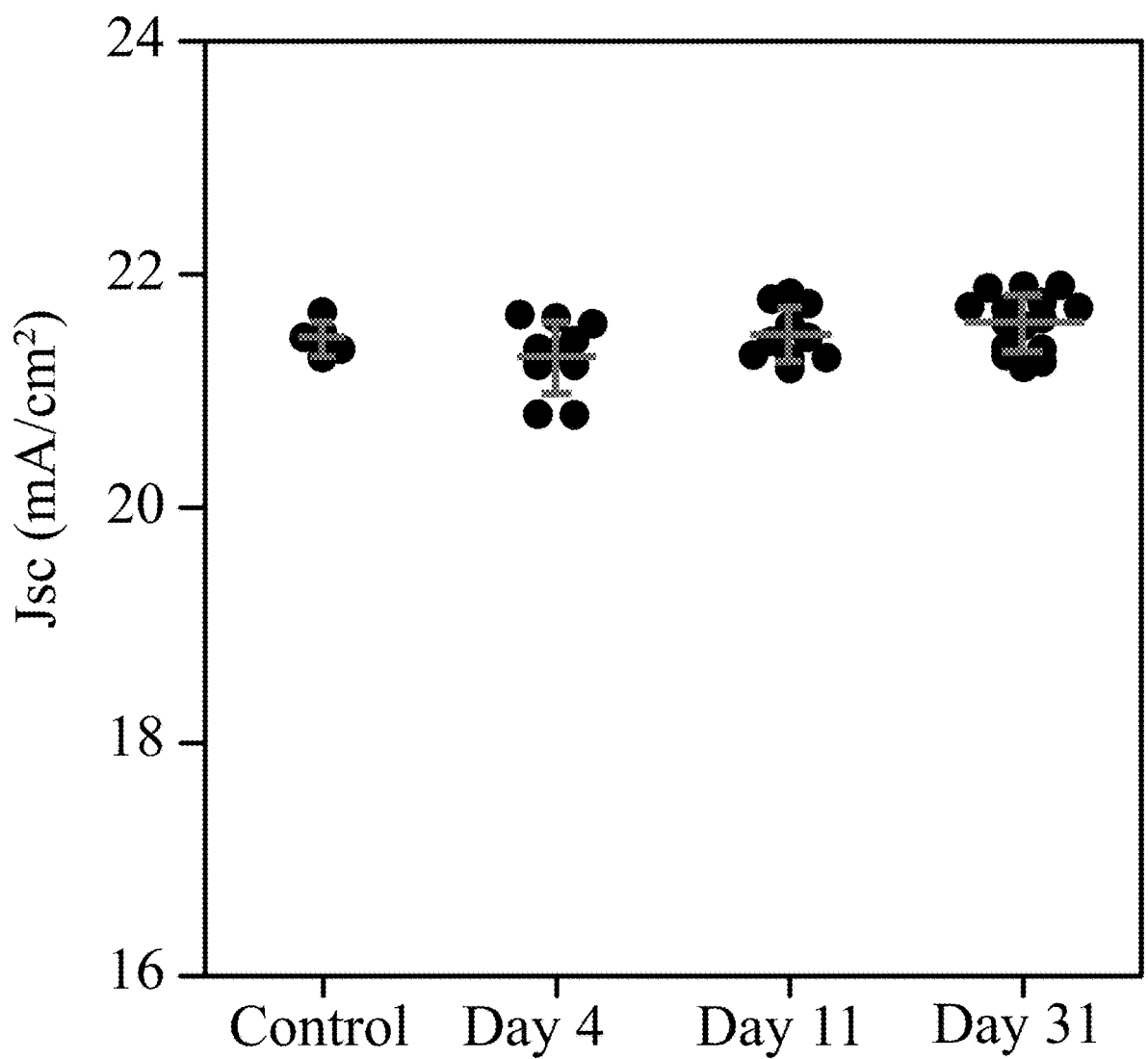
FIG. 12D illustrates the $J_{sc}$ values for the same FAMACs perovskite-containing described in FIG. 12A, according to some embodiments of the present disclosure.

Photographs of FAMACs perovskite films fabricated from a fresh ink (viz., 0 days of storage, labeled as "Day 0"), and from the same ink following storage between 2 days and 81 days are shown in FIG. 3A. The appearance of the deposited films clearly becomes visually lighter as the ink gets older, which is confirmed by reduced light absorption (see FIG. 3B). Profilometry confirms that this change is not due to film thickness variations (see Panel (a) of FIG. 9). In fact, the films thickened somewhat (average thickness from 542 nm on day 0 to 790 nm on day 81) with solution aging. Furthermore, the films roughened (RMS roughness from 7 nm on day 0 to 16 nm on day 81) (see Panel (b) of FIG. 9) with ink aging. Because the ink was stored in nitrogen and in dark, it was of interest to determine what changed in the films deposited from inks with different ages as well as what changed in the starting solutions. To understand the structural changes underlying the change in film absorbance, X-ray diffraction (XRD) measurements were obtained (full XRD spectra are presented in FIG. 10). For the FAMACs films that were fabricated with fresh ink, an intense diffraction peak at a 2θ value of 14.0° is observed (see FIG. 3C), corresponding to the (100) peak of cubic FAMACs. As the ink aged, this peak at 14.0° became weaker (see FIG. 3C) whereas a peak at 11.5° became stronger (see FIG. 3D). This latter peak matches the yellow hexagonal crystalline phase of $FAPbX_3$ but could also be from other compounds as is discussed herein.

Figure 4A:
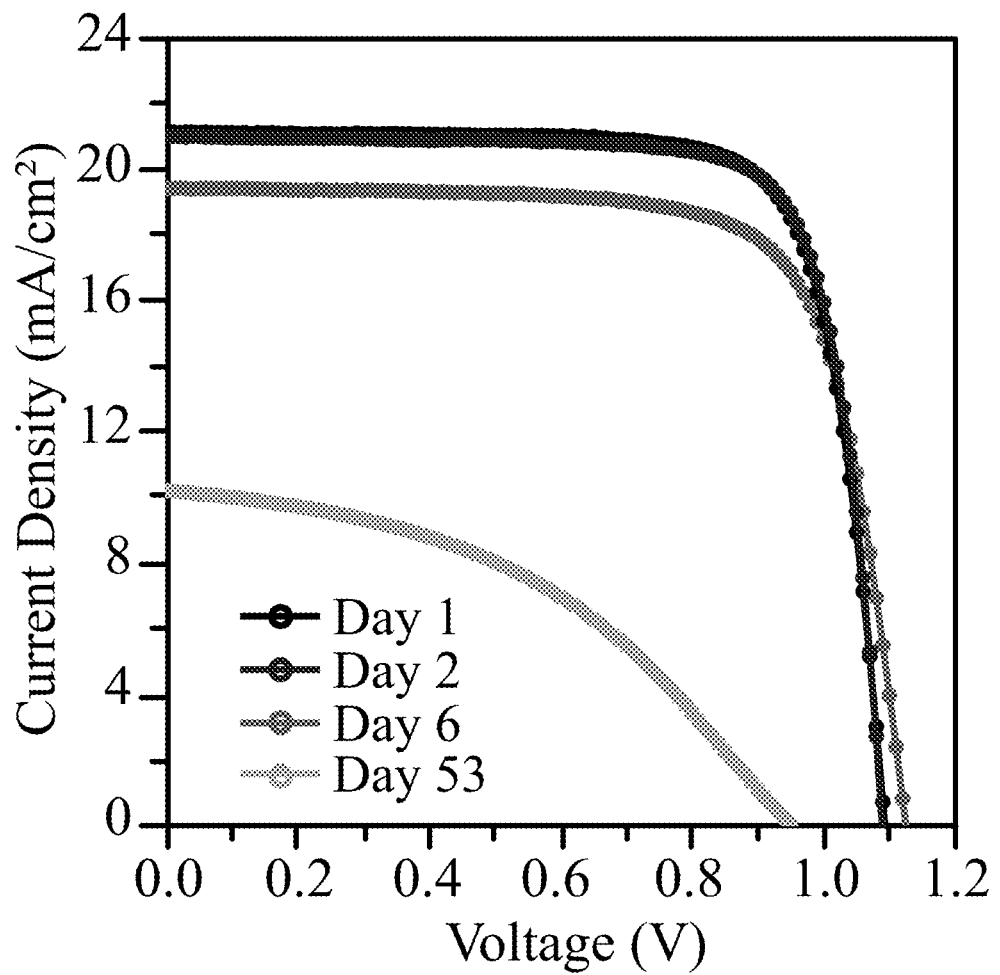
FIG. 4A illustrates J-V curves for the best devices containing perovskite films fabricated with FAMACs inks stored for different times, according to some embodiments of the present disclosure: fresh ink (e.g. 0 days), 1 day, 5 days and 52 days.
Figure 4B:
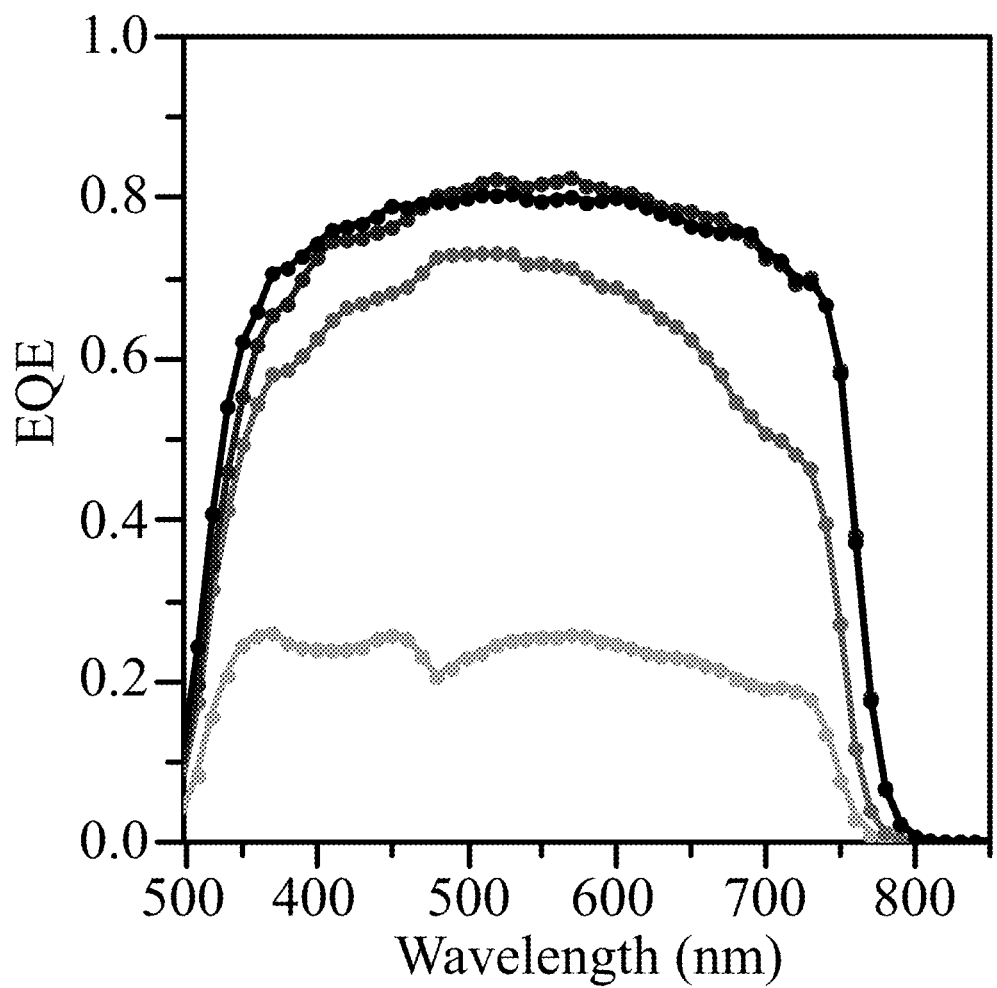
FIG. 4B illustrates external quantum efficiency (EQE) for the best devices containing perovskite films fabricated from FAMACs inks stored for different times, according to some embodiments of the present disclosure: fresh ink (e.g. 0 days), 1 day, 5 days and 52 days.

To understand the effect of these structural changes on solar cell devices, current density-voltage (J-V) and external quantum efficiency (EQE) measurements were performed (see FIGS. 4A and 4B, respectively). Statistics of the devices are presented in FIGS. 11A-11D. In summary, the devices made with fresh ink ("Day 0") show a power conversion efficiency (PCE) of 18.2%, a short-circuit current ($J_{SC}$) of 21.13 mA $cm^{-2}$, an open-circuit voltage ($V_{OC}$) of 1.09 V, and a fill factor (FF) of 77.6%. Devices from ink aged for only one day did not show significant change from devices fabricated with fresh ink, but devices from a 5-day-age ink showed decreases in $J_{SC}$ (19.40 mA $cm^{-2}$) and FF (73.6%) along with an improved $V_{OC}$ (1.13 V). The ~10 nm blue shift in the EQE onset for this device suggests that the decreased $J_{SC}$ and increased $V_{OC}$, at least in part, is due to an active layer composition change such as having less $I^-$ incorporation or smaller A-cite cations in the lead halide perovskites. After aging the ink for 52 days, the device performance dropped to 4.28% PCE, with all photovoltaic parameters ($J_{SC}$=10.22 mA $cm^{-2}$, $V_{OC}$=0.95 V, FF=43.2%) decreased.

Figure 5A:
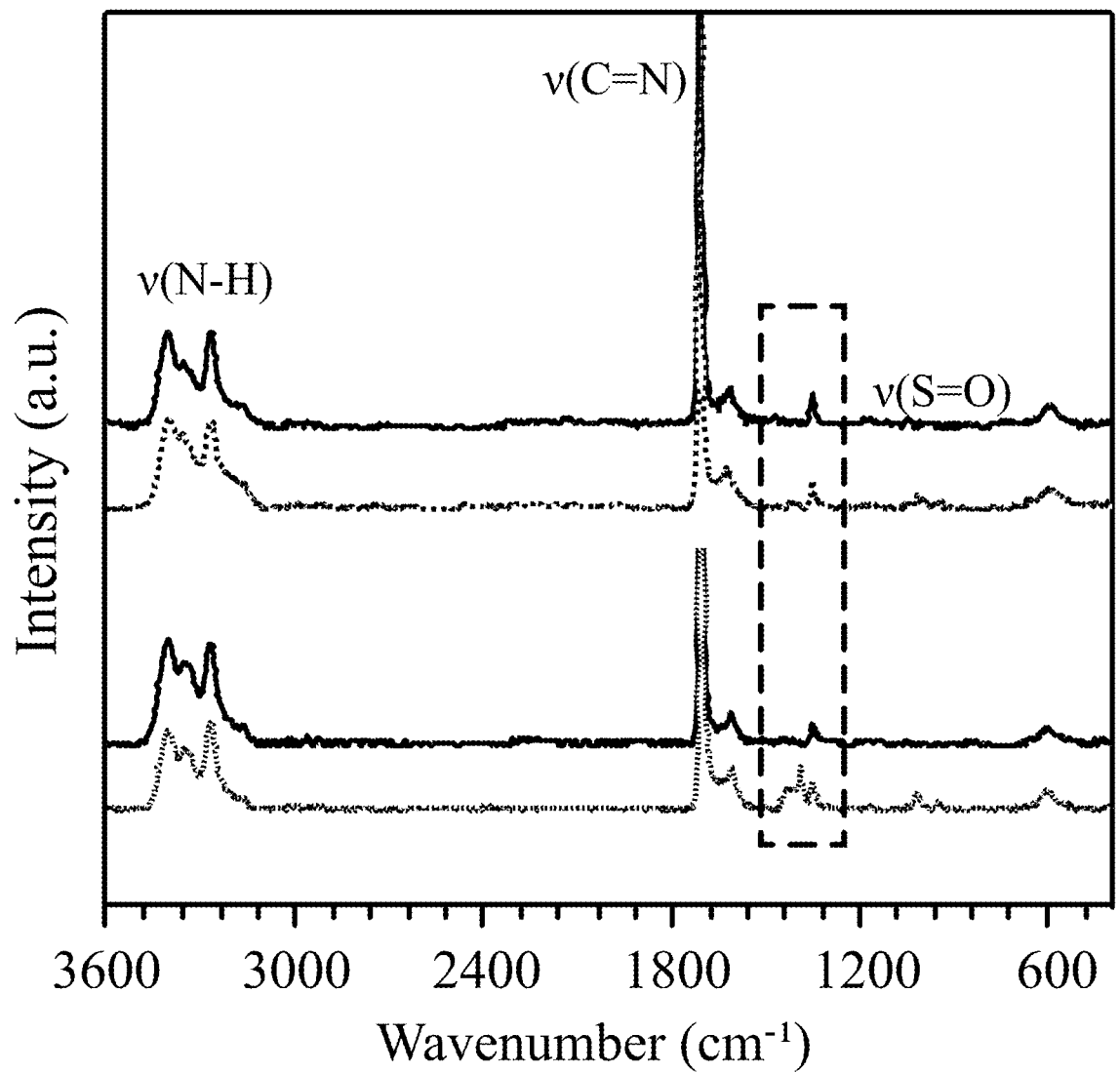
FIG. 5A illustrates FTIR spectra of FAMACs perovskite films that were fabricated from fresh ink (top two lines) and ink stored for 260 days (bottom two lines), according to some embodiments of the present disclosure. Spectra offset for clarity. For each pair, the top line corresponds to after annealing and the lower line to before annealing. All spectra baseline corrected and normalized to the intensity of the $v(C=N)$ vibration.
Figure 5B:
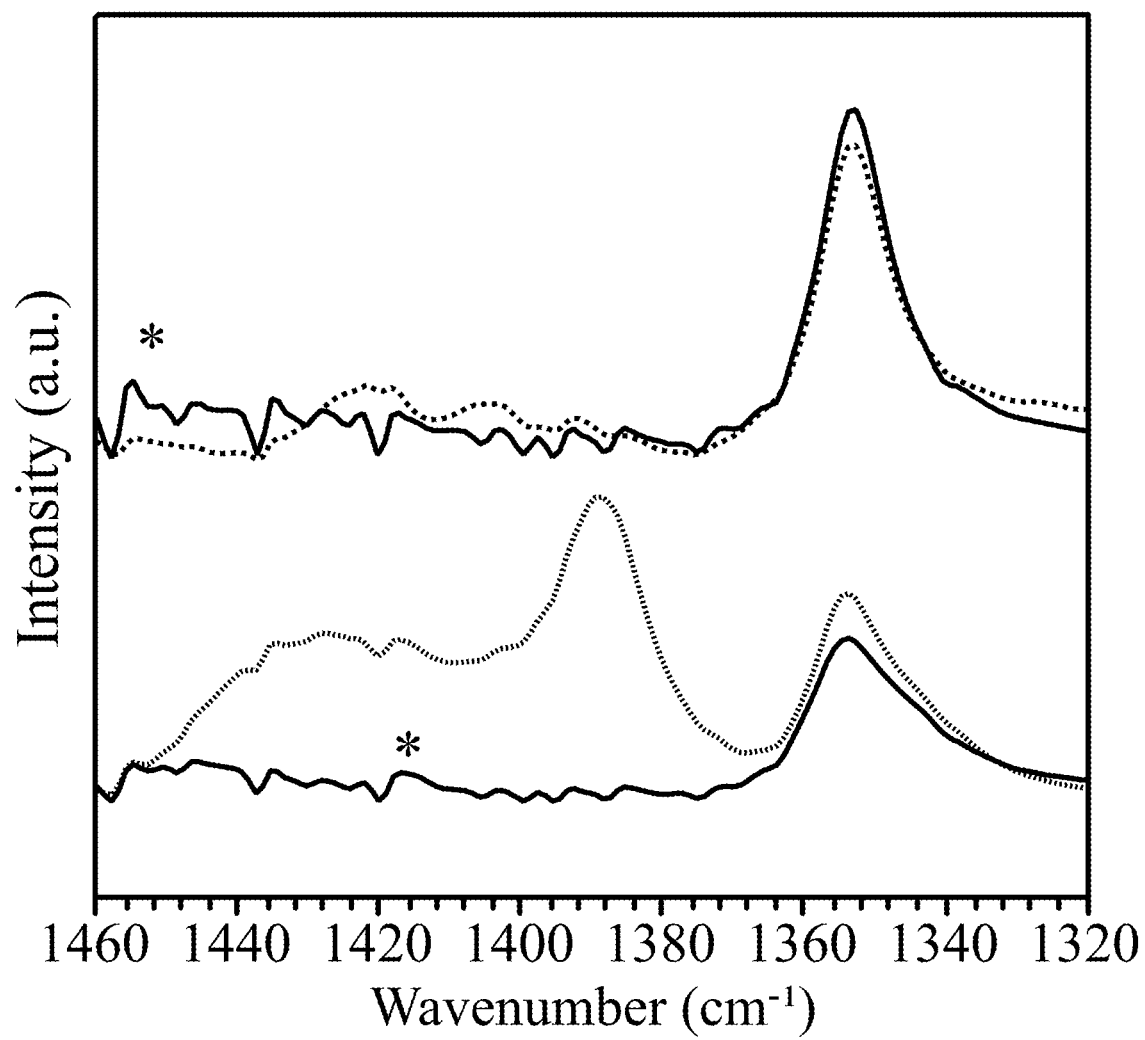
FIG. 5B illustrates the FTIR spectra, $COO^-$ and C—N vibrations, of FAMACs perovskite films that were fabricated from fresh ink (top two lines) and ink stored for 260 days (bottom two lines), according to some embodiments of the present disclosure. Annealed inks are indicated with asterisks. All spectra are baseline corrected and normalized to the intensity of the $v(C=N)$ vibration.

Fourier transform infrared (FTIR) spectroscopy was used to study the organic constituents of the FAMACs films to obtain mechanistic insight into the precursor solution degradation. FIGS. 5A and 5B show FTIR spectra for two films that were respectively made from a fresh ink and an ink having experienced 240 days of aging (stored in the dark, in a nitrogen environment). FTIR spectra were recorded before annealing and after annealing of the perovskite films. Data in FIG. 5A, clearly show the presence of FA in all films with the prominent FTIR peak at 1712 $cm^{-1}$ due to strong C=N symmetric stretching. In addition to this characteristic peak, there are peaks at 3407 $cm^{-2}$, 3359 $cm^{-2}$, 3272 $cm^{-2}$ and 3171 cm$^{-2}$, which are due to the symmetric N—H stretching in the ammonium cations of the lattice. However, in addition to these peaks, the films cast from the aged ink exhibited FTIR peaks (see FIG. 5B) at 1430 cm$^{-2}$ and 1380 cm$^{-2}$, which can be attributed to the characteristic rocking and symmetric vibrational modes, respectively, of the formate anion (HCOO$^-$).

DMF can hydrolyze in the presence of an acid catalyst such as Na$^+$ and other metal compounds. Cs$^+$ and Pb$^{2+}$ and related PbX$^+$ cations are thus likely playing a part in the observed increase of hydrolysis in the precursor solutions. The hydrolysis of DMF yields formic acid (HCOOH) and dimethylamine (DMA), as shown in Scheme 1 below. Interestingly, formic acid can impact the optoelectronic quality of metal halide perovskite films. DMA can form in perovskite solutions due to the acid-catalyzed reaction between DMF and methylamine to yield DMA and N-methylformamide. DMA is a stronger Lewis base than DMF or DMSO and can form stable complexes with Lewis acids such as Cs$^+$, Pb$^{2+}$, and PbX$^+$. The equilibrium of the precursor solution complexes may thus be affected by DMA and formic acid, DMA$^+$ and formate (HCOO$^-$). HCOO$^-$ may interact in stronger fashion with both Cs$^+$ and Pb$^{2+}$, as a bidentate ligand, than halides. HCOO$^-$ clearly remained visible in the aged films by FTIR before annealing, despite an antisolvent treatment used during film deposition. Within the sensitivity of the FTIR, HCOO$^-$ appears to have been removed by the annealing step.

Scheme 1. Proposed ink aging mechanism. Hydrolysis of DMF to formic acid and dimethylamine (DMA) and protonation of DMA for produce formate (HCOO$^-$) and dimethylammonium (DMA$^+$).

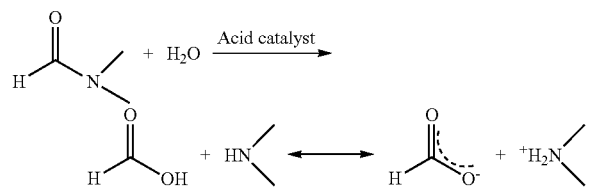

Figure 6A:
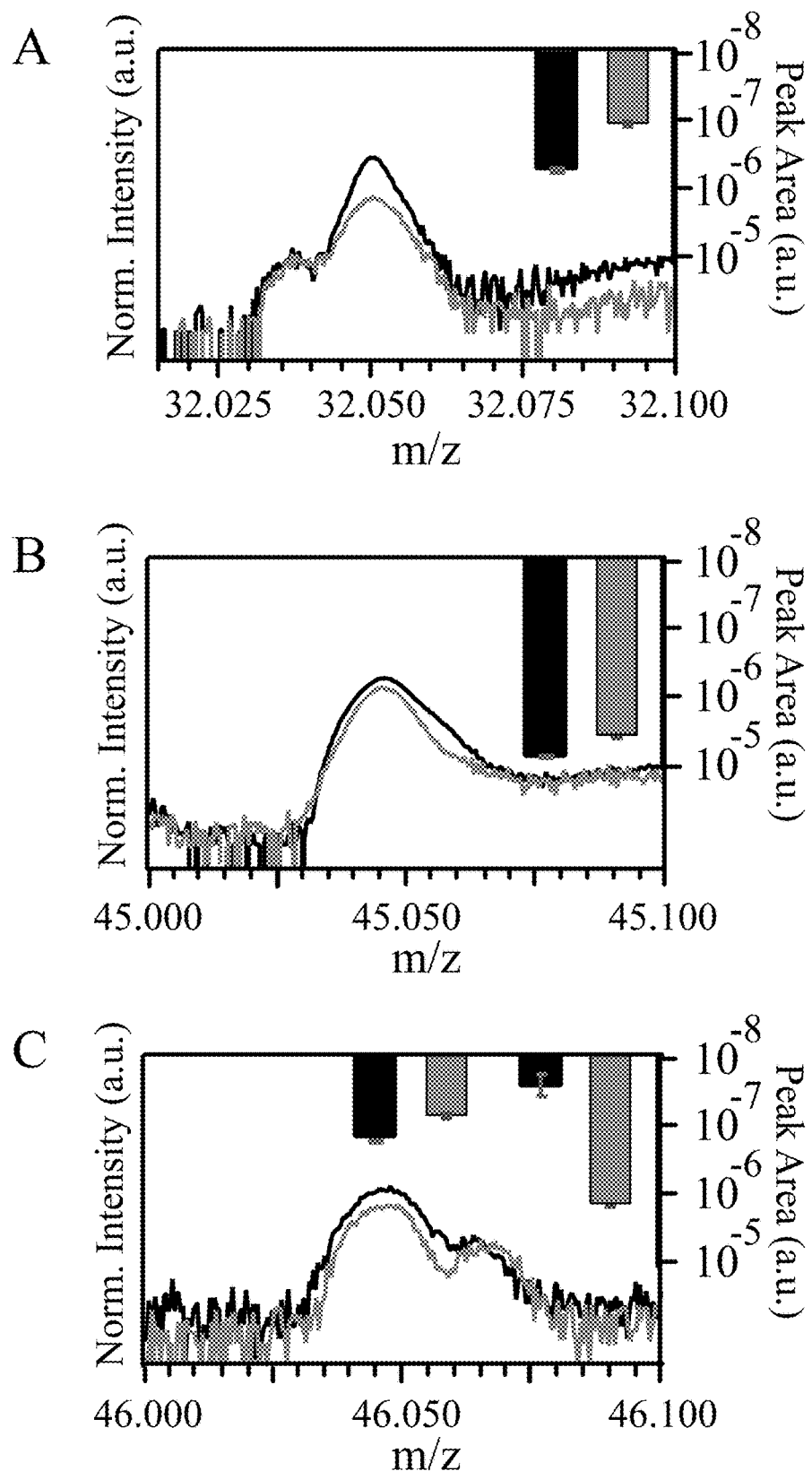
FIG. 6A illustrates ToF-SIMS spectra and integrated peak areas of FAMACs perovskite films made from fresh ink (black lines and bars) and films made from ink stored for 30 days (lighter shaded lines and bars), according to some embodiments of the present disclosure: (Panel A) MA; (Panel B) FA; (Panel C) DMA.
Figure 6B:
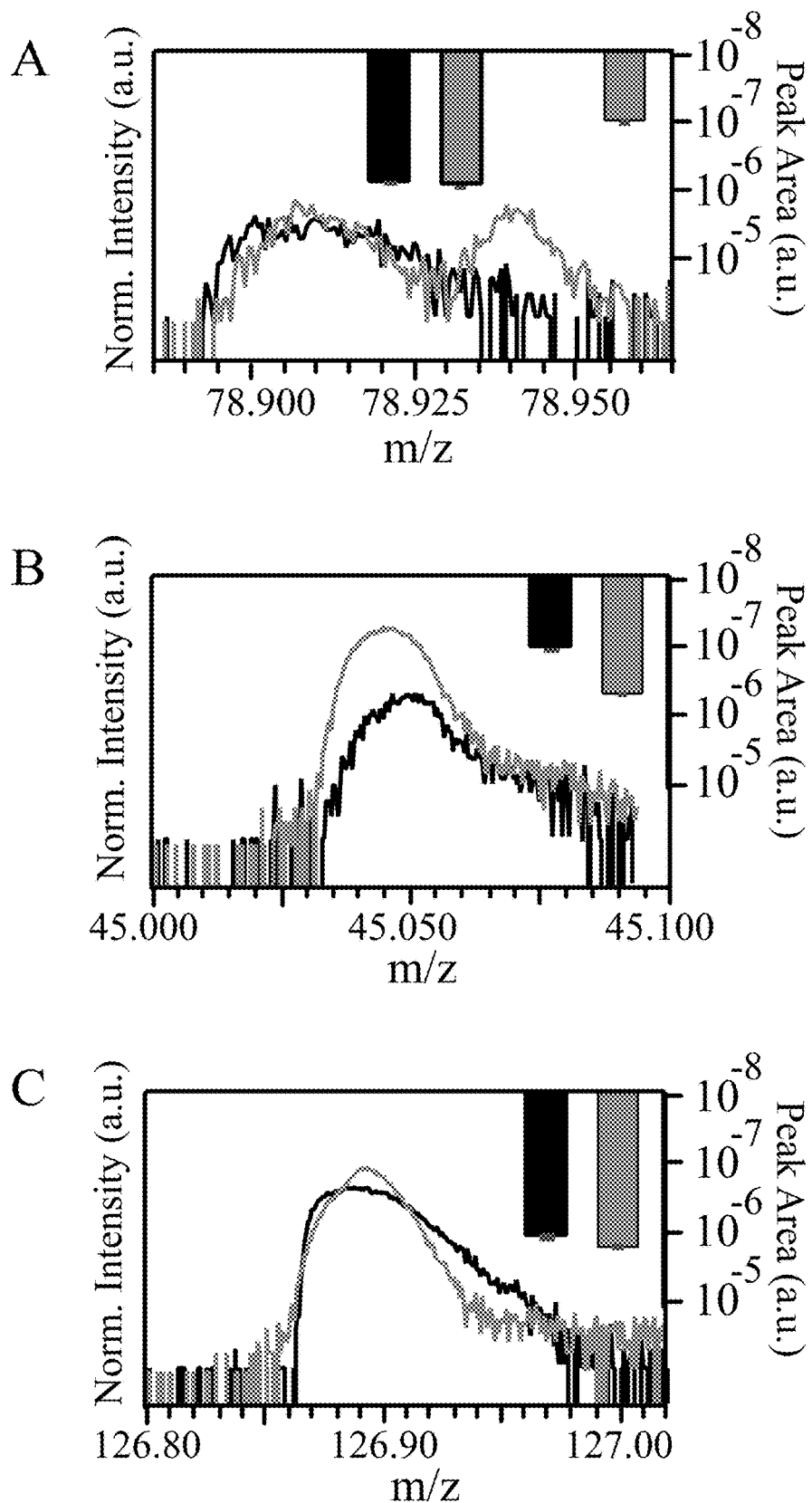
FIG. 6B illustrates ToF-SIMS spectra and integrated peak areas of FAMACs perovskite films made from fresh ink (black lines and bars) and films made from ink stored for 30 days (lighter shaded lines and bars), according to some embodiments of the present disclosure: (Panel A) Br; (Panel B) DMABr; (Panel C) I.
Figure 6C:
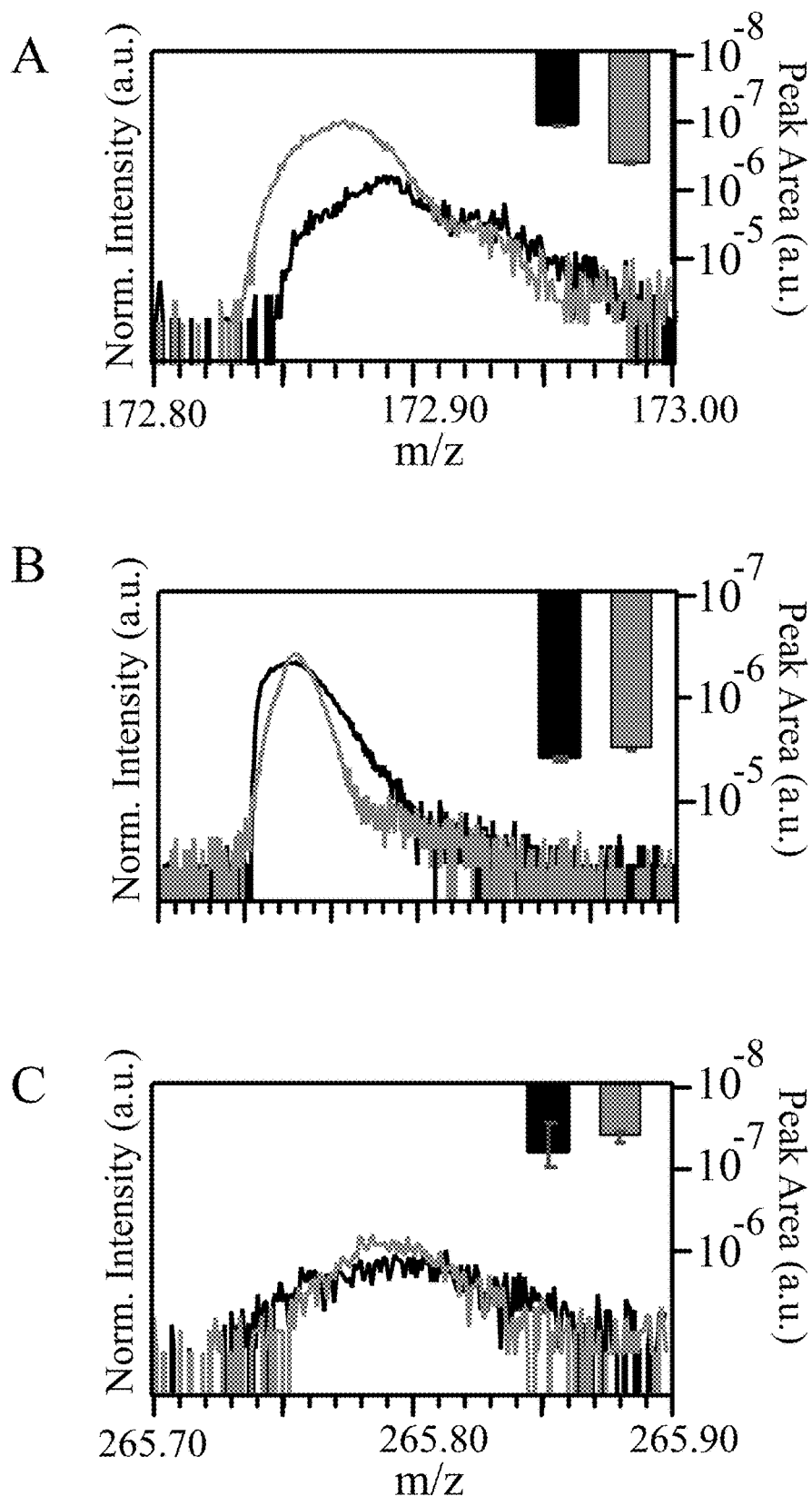
FIG. 6C illustrates ToF-SIMS spectra and integrated peak areas of FAMACs perovskite films made from fresh ink (black lines and bars) and films made from ink stored for 30 days (lighter shaded lines and bars), according to some embodiments of the present disclosure: (Panel A) DMAI; (Panel B) Pb; (Panel C) Cs. Bars in FIGS. 6A-6C show the integrated peak area, fitted through a combination of Gaussian and Lorentzian, of ToF-SIMS signal for each elements. The error bars are standard deviations of the fits.

To further investigate the proposed mechanism, time-of-flight secondary ion mass spectrometry (ToF-SIMS) was used to probe the composition of perovskite films cast from fresh and 30-day old inks (see Panels A-B of each of FIGS. 6A, 6B, and 6C). This technique provided information on all of the chemical species in the films, including the organic components. The ToF-SIMS profiles for MA$^+$, FA$^+$, FAD (D=deuterium), DMA$^+$, Br, DMABr, I$^-$, DMAI, $^{204}$Pb$^{2+}$ and Cs$_2^+$ which correspond, respectively, to m/z ratios of 32.050, 45.046, 46.046, 46.066, 78.911, 124.890, 126.893, 172.890, 203.959, 265.799 were analyzed (see Table 1 below). The obtained ToF-SIMS traces were normalized to the total ion beam counts and integrated through the entire film thickness to obtain a total signal intensity at each m/z. The components in the two samples were then compared by the integrated peak area at the m/z ratio of interest. At each m/z of interest, the ToF-SIMS signal peak area was fitted, through a combination of Gaussian and Lorentzian convolution with linear background, and are presented as bars in FIGS. 6A, 6B, and 6C. Fitting results and its standard deviations are shown with the peak area bars.

TABLE 1

Assignment of key peaks in the ToF-SIMS spectra

| m/z | Fragment[a] | Ionic Charge[b] |
|---|---|---|
| 32.050 | MA | MA$^+$ |
| 45.046 | FA | FA$^+$ |
| 46.046 | FAD | FAD$^+$ |
| 46.066 | DMA | DMA$^+$ |
| 78.911 | Br | Br$^-$ |
| 124.890 | DMABr | DMABr |
| 126.893 | I | I$^-$ |
| 172.890 | DMAI | DMAI |
| 203.959 | Pb | Pb$^{2+}$ |
| 265.799 | Cs | Cs$^+$ |

[a]"Fragment" corresponds to the component tracked by mass spectrometry (all are positive ions).
[b]"Ionic Charge" corresponds to the ionic charge of the component in the perovskite film.

Figure 6D:
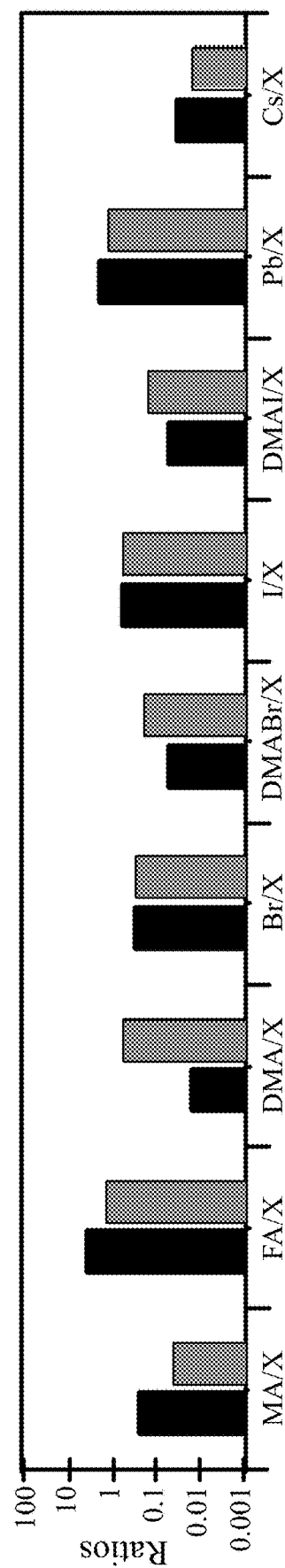
FIG. 6D illustrates, from the ToF-SIMS spectra summarized in FIGS. 6A-6C, the ratios of integrated peak areas as indicated, where X=I+Br, according to some embodiments of the present disclosure.

Compared to the fresh-ink film, a slight decrease in the ToF-SIMS signal intensity was observed in the 30 days-aged-ink films in all cations, including MA$^+$, FA$^+$, Cs$^+$ and Pb$^{2+}$, whereas the changes in the P and Br signals were not statistically significant. Importantly, in addition to these expected signals, the aged sample showed an additional peak at m/z ratios of 46.066 (see Panel C of FIG. 6A). This additional peak is attributed to DMA$^+$, which appeared in the mass spectra as a result of DMF hydrolysis described above. Stronger ToF-SIMS signals were observed at m/z of 124.89 and 172.89, which are attributed to DMABr and DMAI (see Table 1 above) respectively, further confirming the increased content of DMA$^+$ in aged ink film. Using X-site anions' (X=I$^-$+Br$^-$) ToF-SIMS signal intensity, which did not change much with aging, ratios of MA/X, FA/X, DMA/X, Br/X, DMABr/X, I/X, DMAIX, Pb/X, Cs/X were computed and are presented in FIG. 6D. These ratios confirm the proposed scheme where DMA$^+$ has been incorporated into the perovskite film, which is consistent with the increasing film thickness observed with ink aging. DMA$^+$ incorporation harms the optoelectronic properties of the resulting films and the photovoltaic performance of devices.

The ink aging data shown in FIGS. 3A-3D, 4A, and 4B, indicate a blue shift (~10 nm) in absorption onset and EQE in the resulting films. One possible reason for this shift could be proportionally less P incorporation. However, as no significant X-site content (P and Br) changes were observed in the TOF-SIMS, it is unlikely the absorption blue shift is the result of X-site changes. Dimethylammonium lead halide (DMAPbX$_3$) is known to have a wide optical bandgap: 2.39 eV for DMAPbI$_3$ and 3.03 eV for DMAPbBr$_3$; 2.59 eV for DMAPbI$_3$; and 2.58 eV for DMAPbI$_3$. DMA$^+$ incorporation into the deposited MHP films may explain the absorption onset and EQE blue shift that is observed in FIG. 4B. Structurally, the characteristic XRD peak for DMAPbX$_3$ lies at a 2θ of 11.6°, which is very close to the characteristic XRD peak of the yellow, hexagonal phase of FAPbX$_3$. Therefore, the increasing XRD peak at ~11.5° with ink aging (see FIG. 3D) may be due to either hexagonal FAPbX$_3$ and/or DMAPbX$_3$.

It was confirmed that the preferential formation of the hexagonal phase of FAPbX$_3$ with DMA$^+$ is related to the reduced incorporation of MA$^+$ and Cs$^+$, as evidenced by ToF-SIMS, as well as by the larger presence of DMA$^+$. To recover an aged ink and reduce the amount of DMA$^+$ in the film, one strategy investigated herein was to add MA$^+$- and Cs$^+$-containing salts into the aged ink (at 24 days old) to compensate for the loss of MA$^+$ and Cs$^+$ in the FA$^+$ based perovskite. The added perovskite salts included: (1) MABr and CsI, as they are the primary source of MA$^+$ and Cs$^+$, (2)

pure MABr, (3) pure CsI to decouple the effect of MA$^+$ and Cs$^+$, and (4) pure MAI to have excess I$^-$ to address the bandgap shift induced by the DMA$^+$ into FA$^+$-based framework. For simplicity, the quantity of each perovskite salt added to the aged ink was equal to the full amount of each perovskite salt (with Cs$^+$ and MA$^+$ source) used to formulate the fresh ink. The specific amount of the salts added is detailed in Table 2 and Table 3 below. FAMACs films were fabricated using these modified inks. Various characterization data are shown in FIGS. 7A-7F. From the photograph of films shown in FIG. 7A, it is clear that the films became darker in appearance for all modifications. The UV-vis absorption spectra (see FIG. 7B) show that no absorption edge shift, compared to unmodified aged ink-based films, is discernable in the films from modified inks with MABr and CsI, pure MABr, or pure CsI. Conversely, an absorption edge red shift, towards the absorption edge of films deposited from fresh ink, is observed for films cast from the 24 days old ink with additional MAI added. A similar red shift is observed by photoluminescence (PL) spectrum shown in see FIG. 7C, possibly indicating the excess I$^-$ in the solution has effectively changed the bandgap of the resulting film.

Figure 7A:
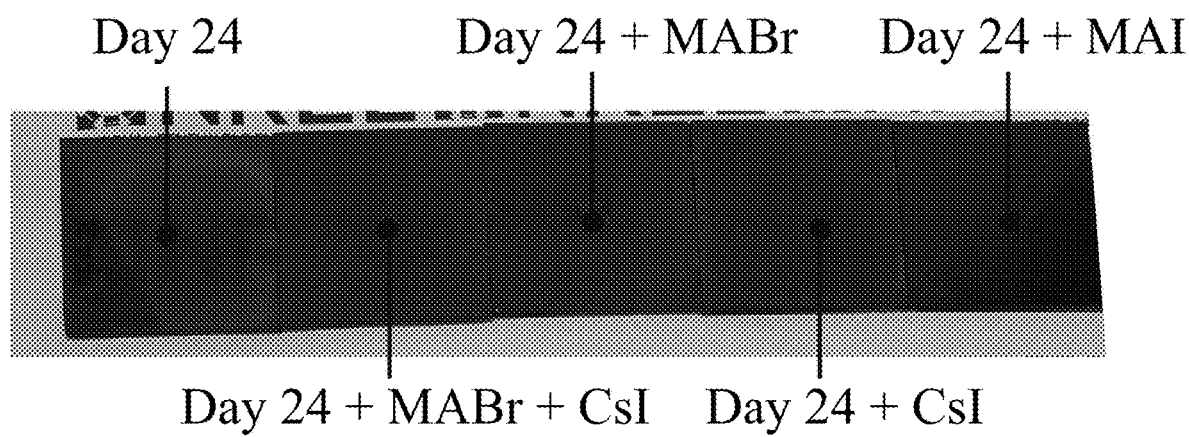
FIG. 7A illustrates photographs of perovskite films that were fabricated from inks stored for 24 days, according to some embodiments of the present disclosure.
Figure 7B:
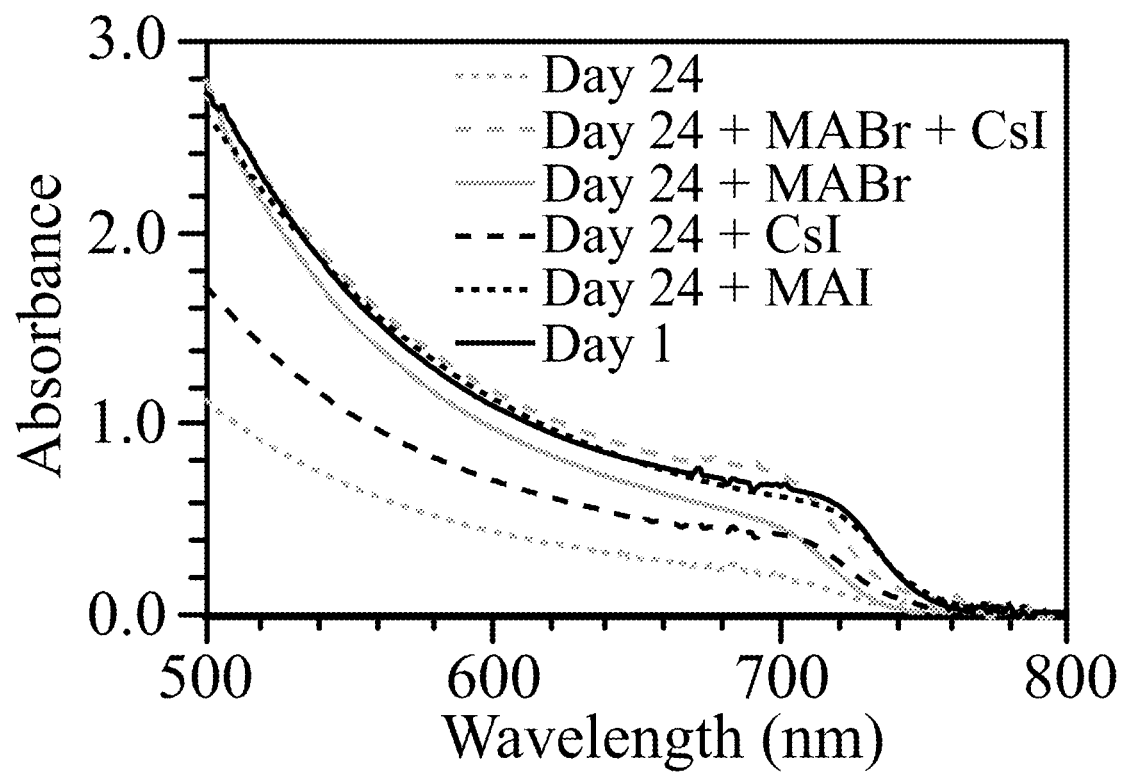
FIG. 7B illustrates UV-vis absorption spectra of perovskite films illustrated in FIG. 7A that were fabricated from 24-day-old ink, and 24-day-old ink with newly added MABr and CsI, or MABr, or CsI, or MAI, according to some embodiments of the present disclosure. The film made from fresh ink (solid black line, 1-3 hours between ink preparation and film deposition) is included as a reference.
Figure 7C:
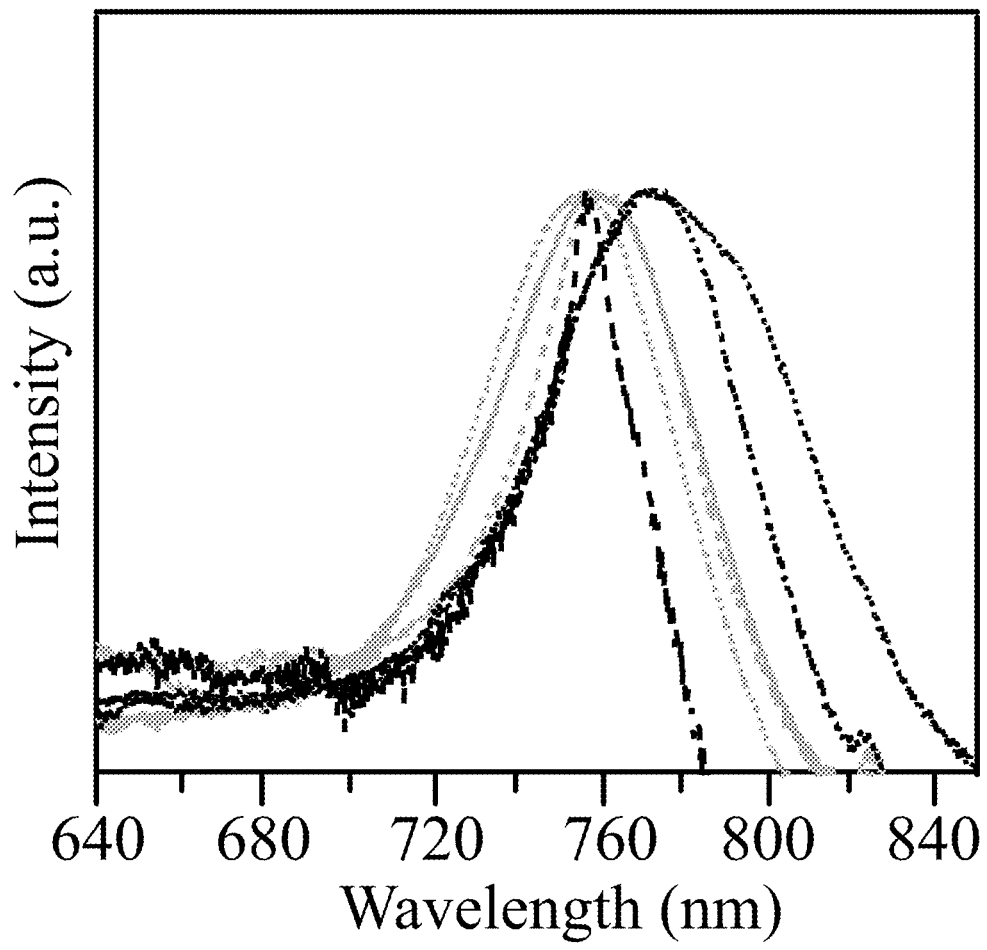
FIG. 7C illustrates PL spectra of the same films described in FIG. 7B, according to some embodiments of the present disclosure. Line types are the same as illustrated in the legend of FIG. 7B.
Figure 7D:
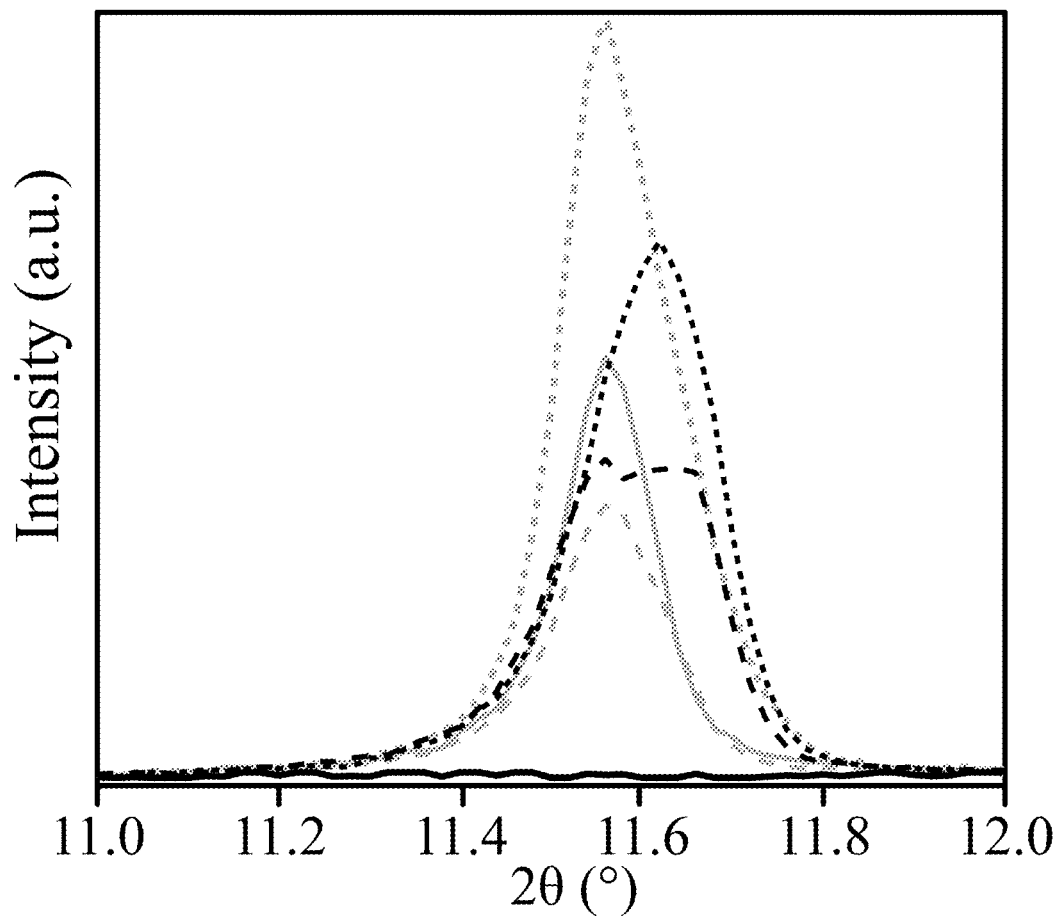
FIG. 7D illustrates XRD patterns (not normalized) of the same films described in FIG. 7B, according to some embodiments of the present disclosure. Line types are the same as illustrated in the legend of FIG. 7B.
Figure 7E:
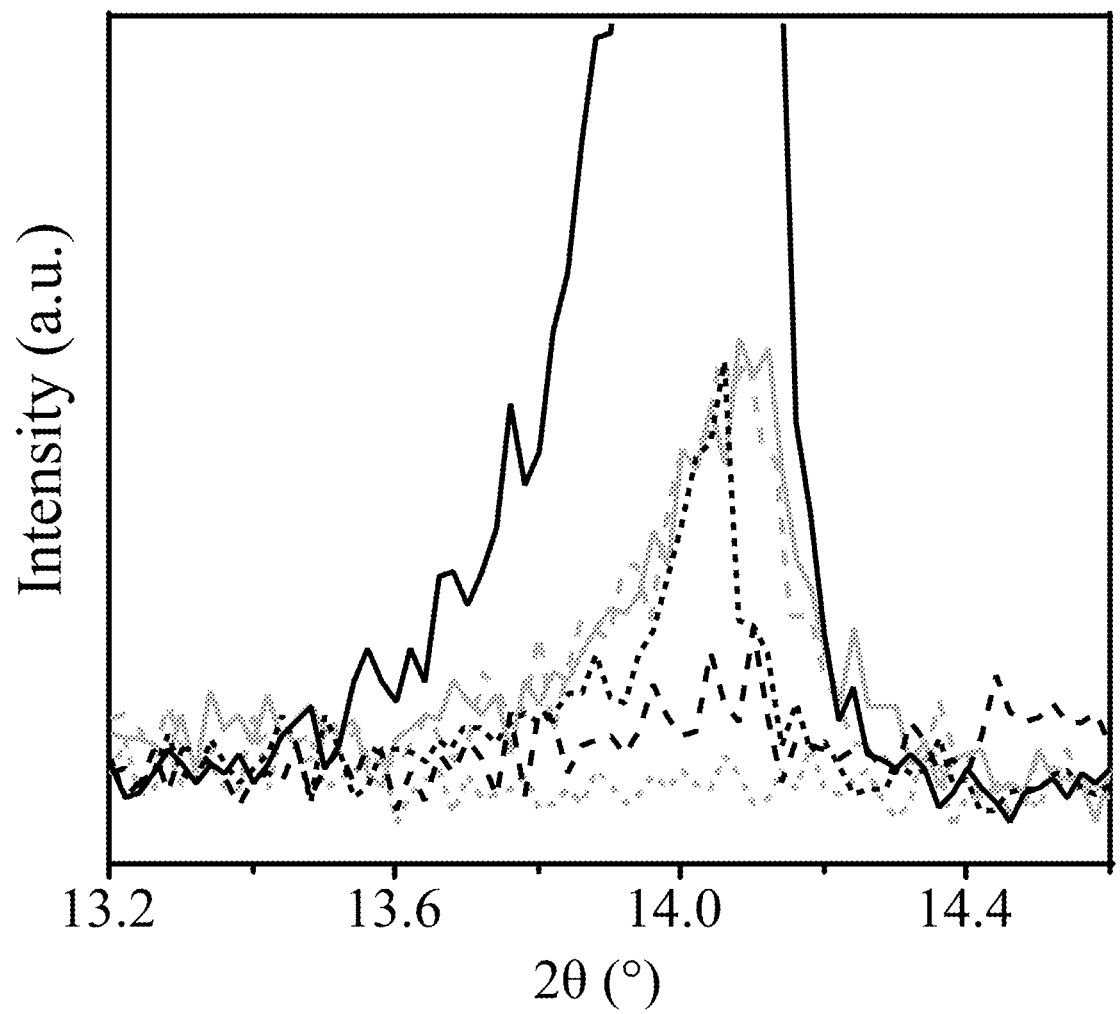
FIG. 7E illustrates XRD patterns (not normalized) of the same films described in FIG. 7B, according to some embodiments of the present disclosure. Line types are the same as illustrated in the legend of FIG. 7B.
Figure 7F:
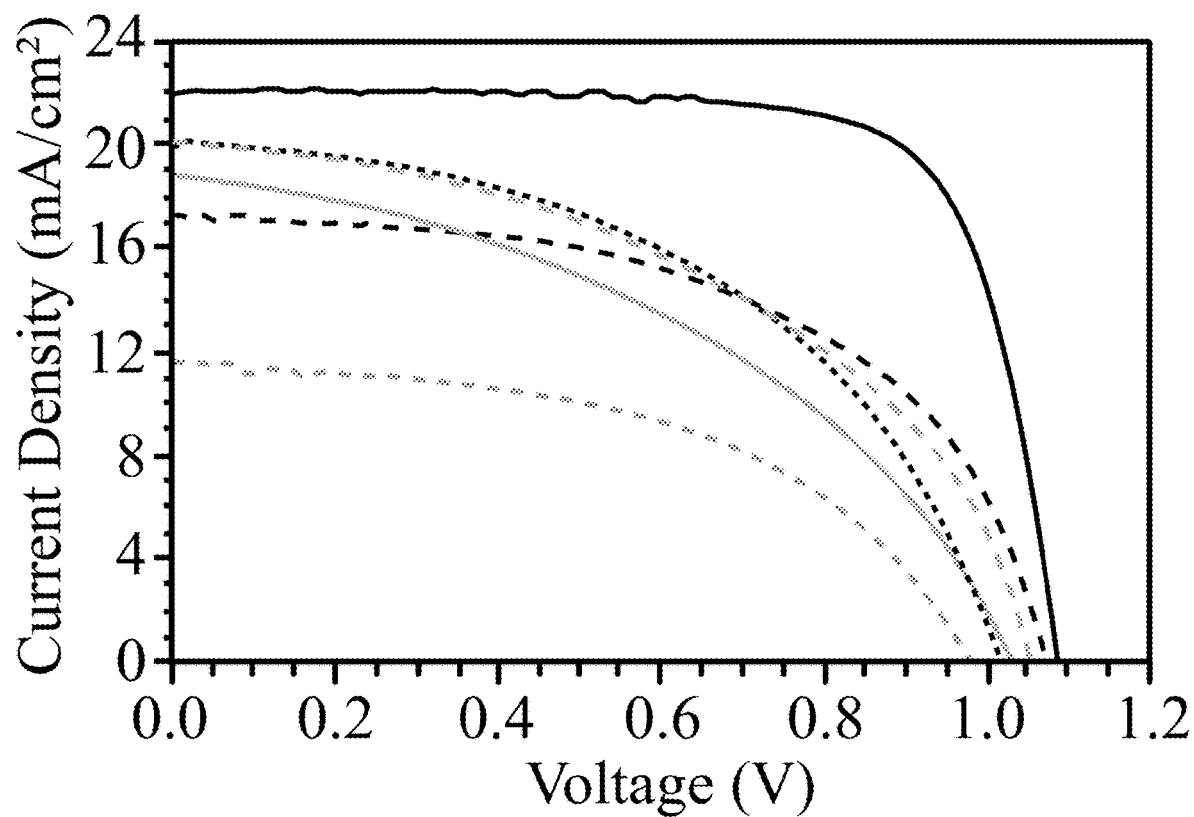
FIG. 7F illustrates J-V curves of the same films described in FIG. 7B, according to some embodiments of the present disclosure. Line types are the same as illustrated in the legend of FIG. 7B.

The effect of aged ink modification was further investigated by examining structural changes with XRD. Consistent with absorption data, all of these ink modifications suppressed the XRD peak at 11.5° and increased the peak intensity at 14.0°. However, none of the modifications made were able to fully suppress the 11.5° peak (see FIGS. 7D and 7E). Having found that adding MA$^+$ and Cs$^+$ containing perovskite salts into aged ink will increase the absorbance of films by suppressing the yellowish DMA$^+$ incorporated FAPbX$_3$, it can be expected that solar cells fabricated from aged FAMACs ink with additional salts will perform better than the devices from the same ink without modification. FIG. 7F shows the device performance for the various ink modifications tested herein. In all cases, the device performance did improve, PCE improved from 5.68% to 9.86% with MABr and CsI addition; to 8.20% with MABr addition; to 10.03% with CsI addition; and to 9.86% with MAI respectively. The improvement is primarily the result of increased J$_{SC}$. While the devices did improve with these modifications, a recovery approaching the performance of the fresh samples did not occur, consistent with the formation and incorporation of DMA$^+$ into the films which cannot be fully remedied by changes to the precursor ink stoichiometry.

It is clear that long-term storage of DMF-based FAMACs perovskite inks is challenging, yet the ability to store these inks remains highly desirable. Naturally, the question arises: what is a practical way to store these precursor salts to avoid inconsistent ink preparation which adversely affect final device performance and/or reduce reproducibility? In light of our understanding of the ink degradation mechanism, it is proposed herein, in some embodiments of the present disclosure, to store the salts in the absence of solvents which may degrade. In some embodiments of the present disclosure, solvent-less storage may be achieved by utilizing a mechanical mixing device, e.g. a ball mill, to uniformly mix the various salts into at least one "master batch" powder formulation of the desired stoichiometry, where such a "master batch" may be stably stored for long periods of time, e.g. up to many months. The solid powder may then be dissolved in DMF and DMSO immediately before use. It should be noted in this experiment, the DMF and DMSO solvents themselves were aging. To minimize this, the solvents were stored in a nitrogen environment.

Figure 8A:
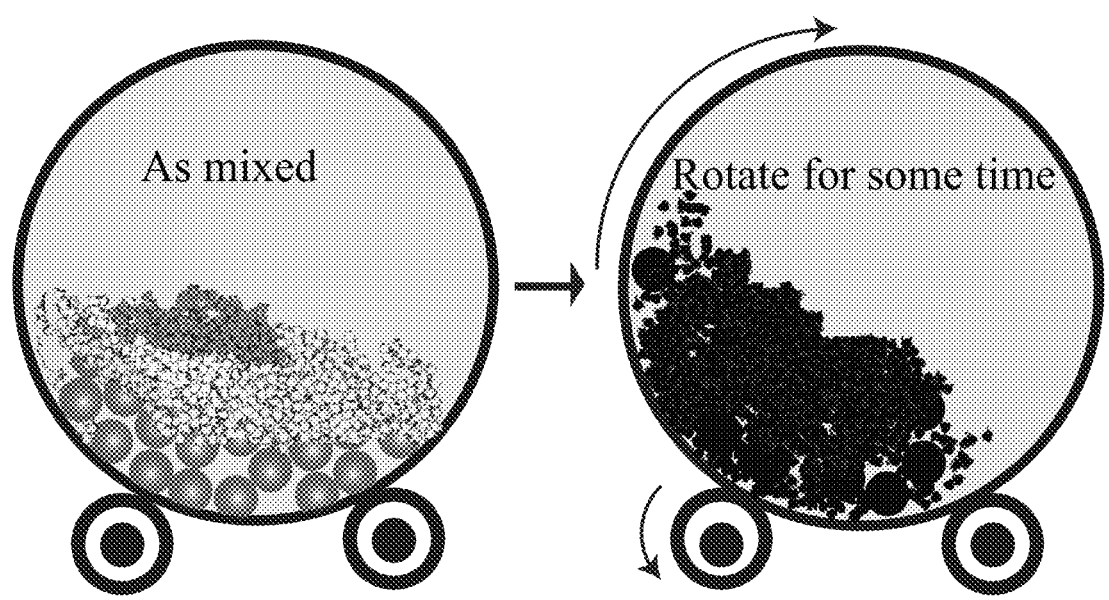
FIG. 8A illustrates a ball-mill process for preparing perovskite precursor materials, according to some embodiments of the present disclosure.
Figure 8B:
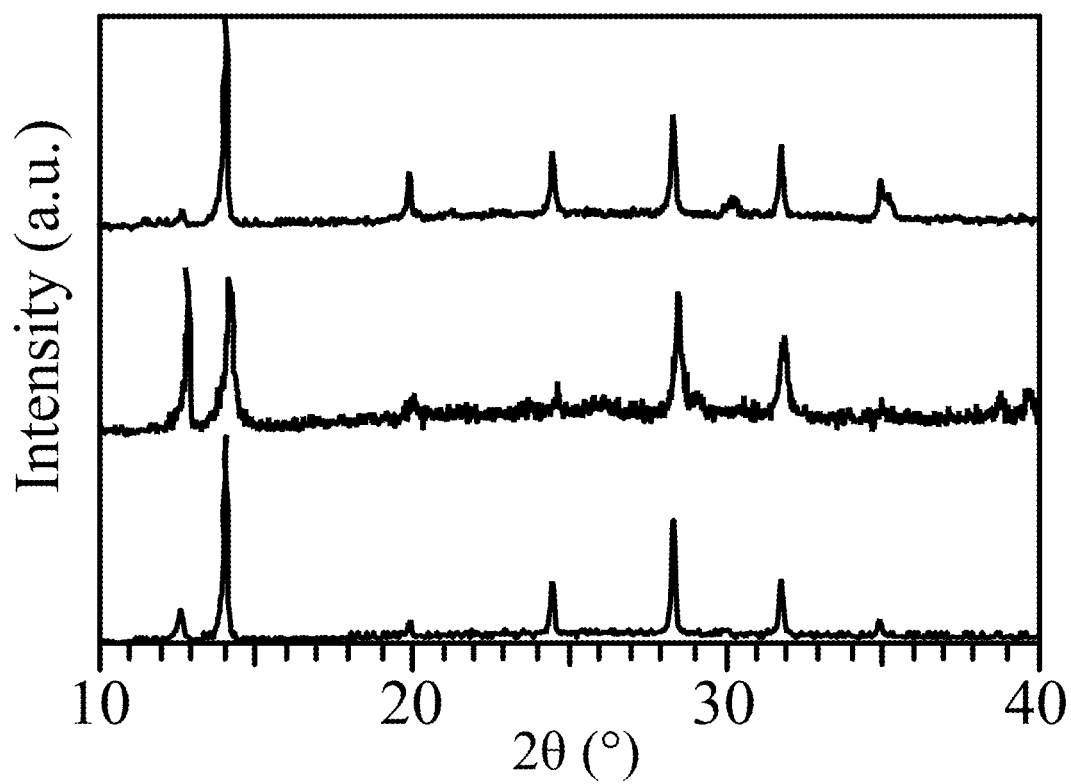
FIG. 8B illustrates XRD patterns of a fresh (i.e. day zero) FAMACs perovskite film (control), ball-milled powder precursor, and fresh film from ball-milled precursor, according to some embodiments of the present disclosure; top, middle, and bottom curves respectively.
Figure 8C:
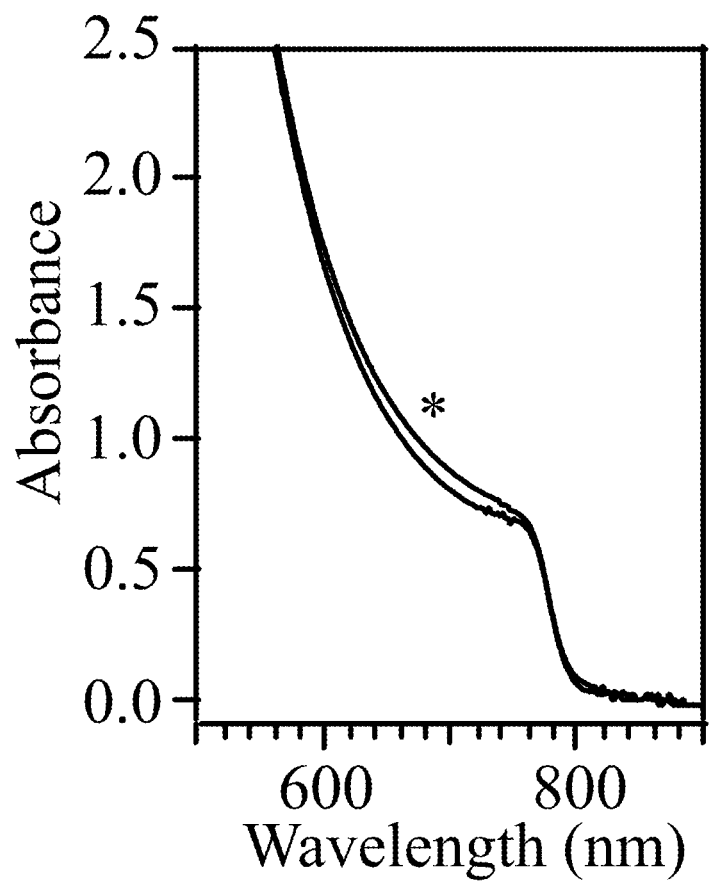
FIG. 8C illustrates absorption spectra of a fresh FAMACs film and fresh film from ball-milled precursors (marked with asterisk), according to some embodiments of the present disclosure.
Figure 8D:
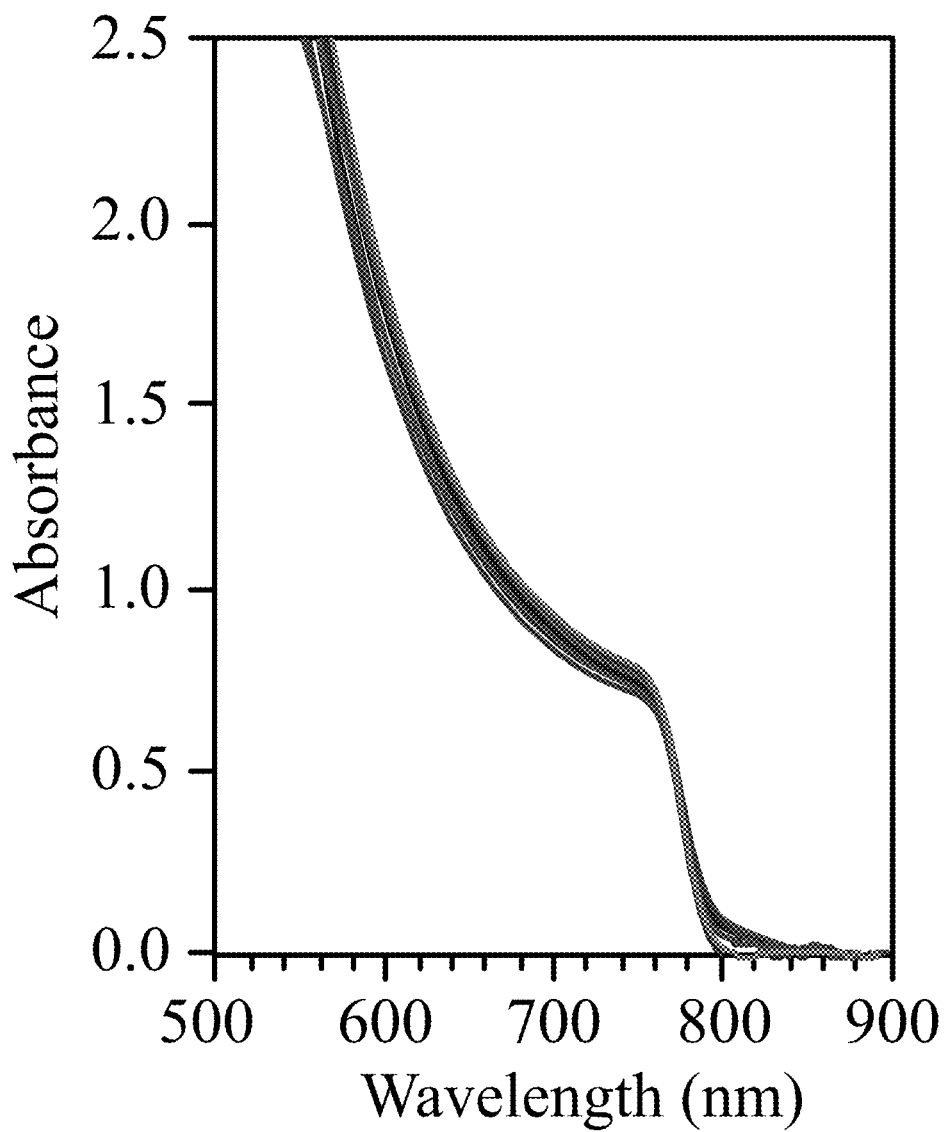
FIG. 8D illustrates absorption spectra of FAMACs perovskite films made from ball-milled salts that were stored for different times (from zero to 31 days), according to some embodiments of the present disclosure.
Figure 8E:
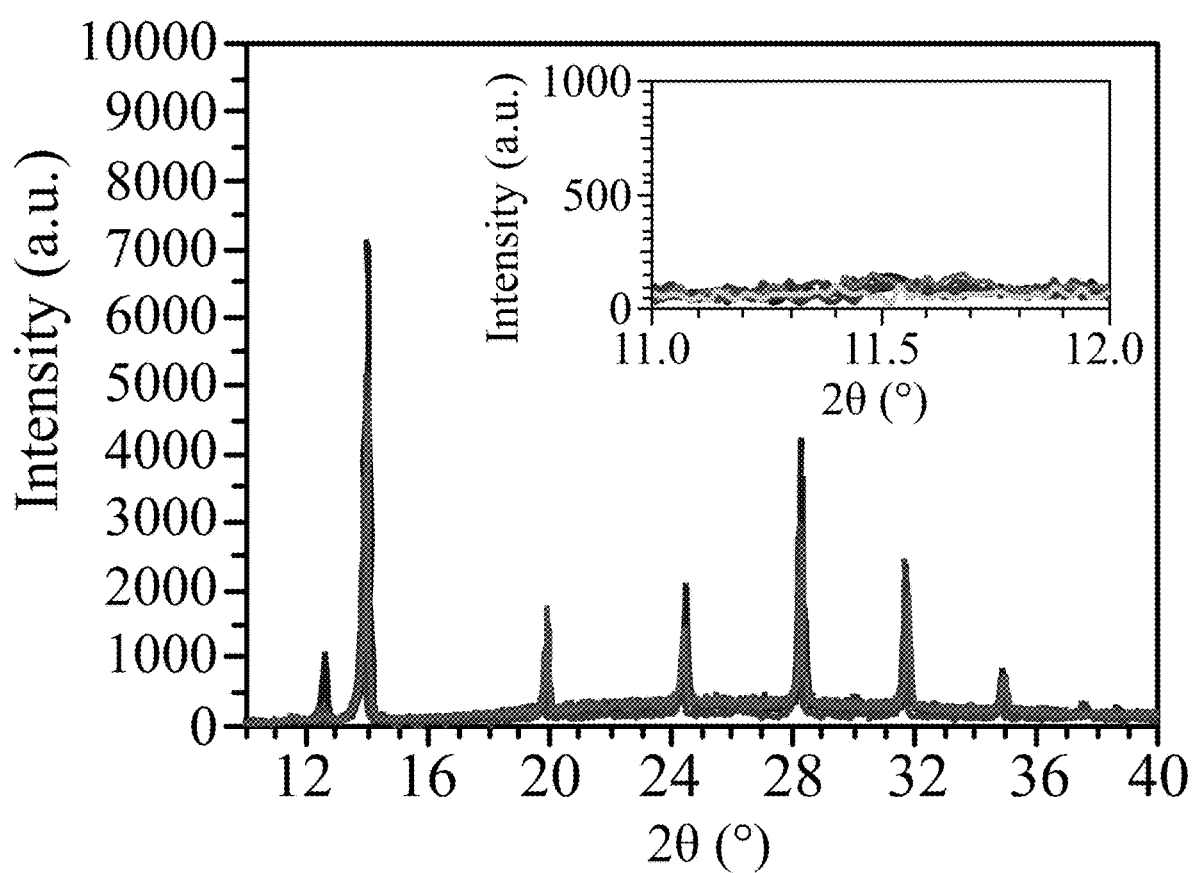
FIG. 8E illustrates XRD patterns of FAMACs perovskite films made from ball-milled salts that were stored for different times (from zero days to 31 days), according to some embodiments of the present disclosure.
Figure 8F:
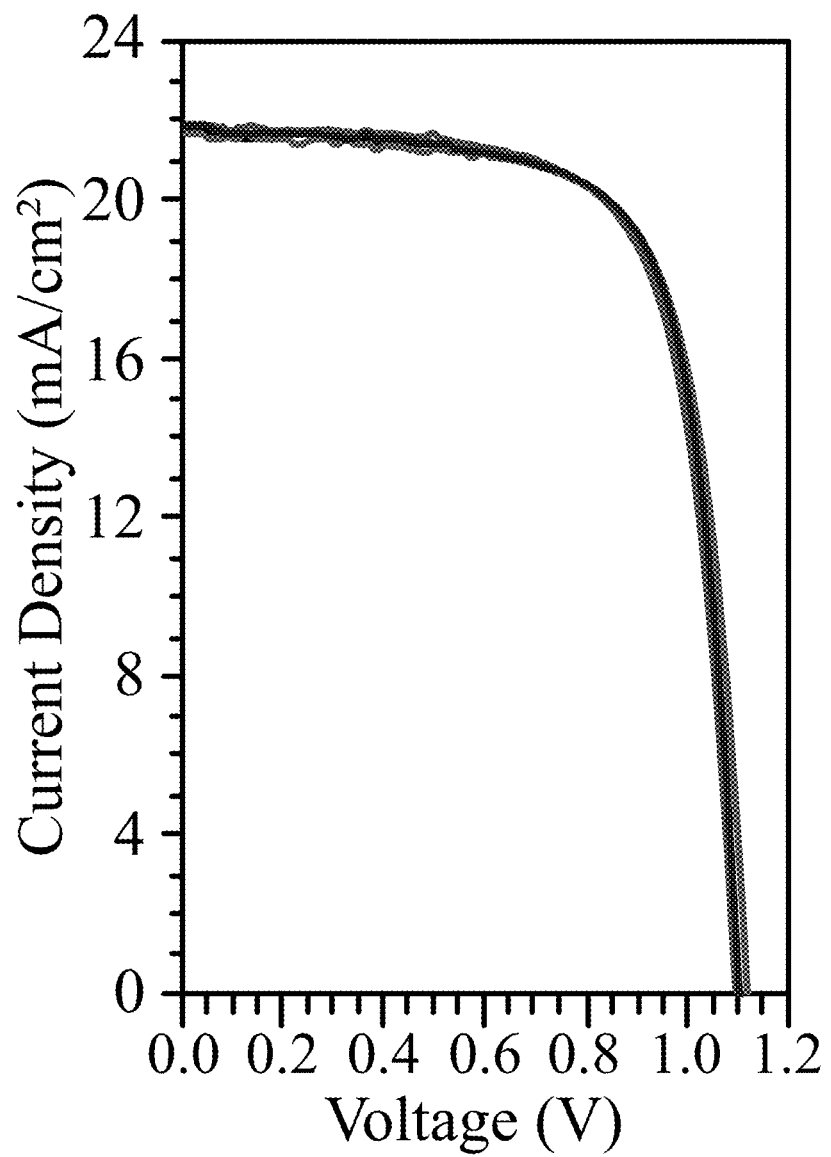
FIG. 8F illustrates J-V characterization of champion FAMACs devices containing FAMACs perovskite films made from ball-milled salts that were stored for different times (0, 4, 11, and 31 days), according to some embodiments of the present disclosure.

FIG. 8A shows the schematic of an exemplary ball mill system. The precursor salts (i.e. starting materials) were mixed in the desired stoichiometry and ball-milled overnight to form a black powder, indicating the formation of perovskite crystals, as confirmed by XRD (see FIG. 8B). The strong XRD peak at 12.5° in the ball-milled powder is attributed to the (001) peak corresponding to unreacted PbI$_2$. The mixed perovskite-containing powders were readily dissolved in DMF and DMSO at the desired concentration before fabricating FAMACs films from the resultant liquid inks. Perovskite films prepared from this ball-milled powder show no discernable differences in either structure or absorption (see FIG. 8C) when compared to the standard ink preparation procedure. To confirm that these mixed salts, at least partially in the form of perovskite crystals, were stable, they were stored for up to 31 days with absorption (see FIG. 8D) and XRD patterns (see FIG. 8E) recorded on films fabricated intermittently throughout this time period. Within the timeframe of the study, no degradation in either the salt mixture or the resultant perovskite film quality was observed. Importantly, the XRD peak at 11.5° corresponding to the hexagonal phase of FAPbX$_3$ or DMAPbI$_3$ was noticeably absent (see the inset of FIG. 8E). Furthermore, FAMACs perovskite devices (with the structure, FTO/SnO$_2$/FAMACs/Spiro-MeOTAD/MoO$_x$/Al) fabricated throughout the time period of this experiment showed no statistically significant changes in performance relative to each other or control devices (see FIG. 8F and FIGS. 12A-12D).

In summary, the chemistry occurring in standard perovskite inks over time is elucidated and shown to modulate the composition and crystal phase of the resulting FAMACs perovskite films. With ink aging, it was determined herein that DMA$^+$ incorporates into the perovskite film, which, along with a reduction of MA$^+$ and Cs$^+$ cations, results in a film that appears yellowish and performs very poorly as a photovoltaic absorber. DMA$^+$ is formed as a result of the hydrolysis of DMF by trace water, catalyzed by an acid catalyst, most likely Cs$^+$, Pb$^{2+}$, or PbX$^+$. The ink aging-induced stoichiometry in the MHP film can be offset to a moderate degree by adding MA$^+$-, Cs$^+$-, and I$^-$-containing salts, evidenced by improved optoelectronic properties of resulting films and devices. To address ink aging-induced phase instability in FAMACs perovskites, a method of storing mixed salts is proposed and validated with various optoelectronic characterizations of FAMACs films and devices from ball mill salts aged for over 30 days. This study highlights the degradation in highly alloyed perovskites inks relevant to their use in commercialization of MHP-based optoelectronics and offers an effective alternative method of precursor storage, which can readily be implemented in the lab or on the full-scale manufacturing line.

TABLE 2

Additional salts added to the 24 days aged ink with total ink volume of ~200 ul

| Perovskite salts | FAI (mg) | PbI$_2$ (mg) | MABr (mg) | PbBr$_2$ (mg) | CsI (mg) | DMF (ul) | DMSO (ul) | MAI (mg) |
|---|---|---|---|---|---|---|---|---|
| Fresh ink | 33 | 97 | 4 | 14 | 3 | 153 | 46 | — |
| 24 days aged ink + MABr + CsI | — | — | 4 | — | 3 | — | — | — |
| 24 days aged ink + MABr | — | — | 4 | — | — | — | — | — |
| 24 days aged ink + CsI | — | — | — | — | 3 | — | — | — |
| 24 days aged ink + MAI | — | — | — | — | — | — | — | 6 |

TABLE 3

Ion weight corresponding to Table 2

| ions | Cs$^+$ (mg) | M$^+$ (mg) | FA$^+$ (mg) | Pb$^{2+}$ (mg) | I$^-$ (mg) | Br$^-$ (mg) |
|---|---|---|---|---|---|---|
| Fresh ink | 1.6 | 1.2 | 8.6 | 51.6 | 79.5 | 240 |
| 24 days aged ink + MABr + CsI | 1.5 | 1.1 | — | — | 1.5 | 2.9 |
| 24 days aged ink + MABr | — | 1.1 | — | — | — | 2.9 |
| 24 days aged ink + CsI | 1.5 | — | — | — | 1.5 | — |
| 24 days aged ink + MAI | — | 1.2 | — | — | 4.8 | — |

TABLE 4

Device performance corresponding to the J-V characteristics of FIG. 7F

| J-V parameters | Voc (V) | Jsc (mA cm$^{-2}$) | FF (%) | PCE (%) |
|---|---|---|---|---|
| 24 days aged ink | 0.98 | 11.54 | 50.2 | 5.68 |
| 24 days aged ink + MABr + CsI | 1.05 | 20.11 | 46.8 | 9.86 |
| 24 days aged ink + MABr | 1.03 | 18.82 | 42.3 | 8.20 |
| 24 days aged ink + CsI | 1.07 | 17.22 | 54.0 | 10.03 |
| 24 days aged ink + MAI | 1.02 | 20.13 | 48.0 | 9.86 |
| Fresh ink | 1.09 | 22.08 | 74.3 | 17.88 |

Methods:

Materials: Fluorine-doped SnO$_2$-coated transparent conducting glass (FTO) was purchased from Thin Film Devices Co. MAI, FAI, and MABr were from Dyesol. PbI$_2$ (99.9985%), PbBr$_2$ (99.999%), SnO$_2$ (15% in H$_2$O colloidal dispersion) and CsI were from Alfa Aesar. Spiro-MeOTAD (>99.5%) was from Lumtec. All other chemicals and solvents were obtained from Sigma-Aldrich and used as received.

Perovskite ink preparation and storage: The FAMACs inks were prepared as follows. The FAMACs ink containing FAI (1 M), MABr (0.2 M), PbI$_2$ (1.1 M), PbBr$_2$ (0.2 M) and CsI (0.05 M) in 4:1 v/v dimethyl formamide (DMF): dimethyl sulfoxide (DMSO) were prepared in N$_2$ glovebox and then the ink was split into multiple small vials and stored in a dark container in a N$_2$ glovebox. The stored inks remained in unopened vials to avoid possible evaporation of the solvent over time.

Perovskite film deposition: The FAMACs ink with different aging were spin-coated with spin-coating parameters as 1000 r.p.m. for 10 seconds and 6000 r. p. m. for 20 seconds. With approximately 5 seconds remaining in this spin-coating procedure, 0.1 mL of chlorobenzene was dripped onto the spinning substrate in a continuous stream. The films were then annealed on a hotplate for 1 hour at 100° C. All precursor preparation, film deposition and annealing were performed in a N$_2$ glovebox.

Ball-mill salts preparation: FAI (3.54 g), MABr (0.461 g), PbI$_2$ (10.44 g), PbBr$_2$ (1.511 g) and CsI (0.339 g) were placed in plastic vial with steel balls with a diameter of 3 mm. The vial was placed in a ball-mill roller overnight. Then, the resulted black powders were recovered into a new vial and stored in dark and N$_2$. All the work was performed in a N$_2$ glovebox.

Film characterizations: Photographs were taken on a Samsung smart phone. UV-visible absorptance were recorded on a Shimadzu UV-vis-NIR 3600 spectrometer and PL was taken with a Horiba Jobin Yvon fluoromax-4 spectrophotometers. XRD spectrum were recorded with a Rigaku D-Max 2200 with Cu Kα radiation. Thickness and roughness of the films were measured with a Dektak 8 profilometer. Roughness RMS is the average of 6000 data points over 400 μm.

Fourier Transform Infrared Spectroscopy: Aged and freshly-prepared FAMACs inks were spin-coated onto Si wafers coated with 100 nm aluminum. FTIR spectra were obtained in diffuse reflectance mode using a Bruker Alpha spectrometer. Spectra were collected by averaging 100 scans at 2 cm$^{-1}$ resolution.

Time-of-flight secondary ion mass spectrometry (ToF-SIMS): An ION-TOF TOF-SIMS V was used for depth-profiling the perovskite films. Analysis was completed using a 3-lens 30-kV Bi—Mn primary ion gun, and the Bi+ primary-ion beam (operated in bunched mode; 10-ns pulse width, analysis current of 1.0 pA) was scanned over a 25×25-micron area. Depth profiling was accomplished with a 1 kV oxygen-ion sputter beam (10.8 nA sputter current) raster of 150×150-micron area. All spectra during profiling were collected at a primary ion dose density of 1×10$^{12}$ ions cm$^{-2}$ to remain at the static-SIMS limit.

Solar cell fabrication: Pre-patterned FTO glass slides were cleaned by UV-ozone treatment for 15 minutes. SnO$_2$ were deposited on the cleaned substrates with SnO$_2$ nanoparticle solution of concentration of 2.67% and spin cast onto the substrates with spinning procedure as 3,000 r.p.m. for 30 seconds. The as-spin cast films were annealed on a hotplate for 30 minutes at 150° C. in air. The films were again cleaned by UV-ozone treatment for 15 minutes immediately before perovskite film deposition (described above). On top of the perovskite layer, spiro-MeOTAD was deposited by spin casting (3000 r.p.m. for 30 seconds) a chlorobenzene solution containing 72 mg/mL spiro-MeOTAD, 0.028 mL/mL 4-tert-butylpyridine, and 0.017 mL of a bis (trifluoromethanesulfonyl)imide lithium salt (Li-TFSI) stock solution. The Li-TFSI stock solution consisted of 520 mg of Li-TFSI dissolved in 1 ml of acetonitrile. Following spiro-OMeTAD deposition, the films were left in a desiccator in air overnight. Finally, 15 nm of MoO$_x$ and 150 nm of Al were deposited on top of the spiro-MeOTAD by thermal evaporation to complete the devices.

Device characterizations: J-V curves were taken in ambient environment with 100 mA cm$^{-2}$ AM1.5G illumination. The solar simulator was calibrated with an encapsulated Si cell with KG 2 filter. The devices were masked with a metal aperture with size as 0.059 cm² when performing the J-V scans, including both forward (−0.3 V to 1.2 V) and reverse (1.2 V to −0.3V) scans, which were done at 100 mV s⁻¹ without prior voltage bias or light soaking. The EQE was measured using a Newport Oriel IQE-200. All measurements were performed in $N_2$ glovebox.

EXAMPLES

Example 1. A composition comprising a perovskite crystal, wherein the perovskite crystal is in the form of a powder.

Example 2. The composition of Example 1, wherein the powder has a particle size between about 1 μm and about 1 mm.

Example 3. The composition of Example 1, wherein the perovskite crystal comprises at least one of a three-dimensional (3D), a two-dimensional (2D), a one-dimensional (1D), or a zero-dimensional (0D) perovskite.

Example 4. The composition of Example 1, wherein the perovskite crystal is semiconducting and photovoltaically active.

Example 5. The composition of Example 3, wherein: the perovskite crystal comprises a stoichiometry defined by $ABX_3$, A is a first cation, B is a second cation, and X is an anion.

Example 6. The composition of Example 5, wherein the first cation comprises at least one of formamidinium (FA), methylammonium (MA), or cesium.

Example 7. The composition of Example 5, wherein the second cation comprises at least one of lead or tin.

Example 8. The composition of Example 5, wherein the anion comprises a halogen anion.

Example 9. The composition of Example 6, comprising $Cs_{1-x-y}MA_xFA_yPb(I_{1-w}Br_w)_3$, wherein each of w, x, and y are between greater than or equal to zero and less than or equal to one.

Example 10. The composition of Example 1, wherein the composition is substantially free of dimethylammonium ($DMA^+$).

Example 11. The composition of Example 10, wherein the absence of $DMA^+$ is determined by time-of-flight secondary ion mass spectrometry.

Example 12. The composition of Example 1, further comprising a perovskite precursor.

Example 13. The composition of Example 12, wherein the perovskite precursor comprises at least one of $PbI_2$, methylammonium bromide (MABr), methylammonium iodide (MAI), or cesium iodide (CsI).

Example 14. A photovoltaic device comprising: a layer of a perovskite material, wherein: the perovskite material is substantially free of dimethylammonium formate (DMAF).

Example 15. The photovoltaic device of Example 14, wherein the absence of DMAF is determined by time-of-flight secondary ion mass spectrometry.

Example 16. The photovoltaic device of Example 14, wherein the perovskite material comprises at least one of a three-dimensional (3D), a two-dimensional (2D), a one-dimensional (1D), or a zero-dimensional (0D) perovskite.

Example 17. The photovoltaic device of Example 14, wherein the perovskite material is a semiconductor and is photovoltaically active.

Example 18. The photovoltaic device of Example 17, wherein: the perovskite material comprises a stoichiometry defined by $ABX_3$, A is a first cation, B is a second cation, and X is an anion.

Example 19. The photovoltaic device of Example 18, wherein the first cation comprises at least one of formamidinium (FA), methylammonium (MA), or cesium.

Example 20. The photovoltaic device of Example 18, wherein the second cation comprises at least one of lead or tin.

Example 21. The photovoltaic device of Example 18, wherein the anion comprises a halogen anion.

Example 22. The photovoltaic device of Example 19, comprising $Cs_{1-x-y}MA_xFA_yPb(I_{1-w}Br_w)_3$, wherein each of w, x, and y are between greater than or equal to zero and less than or equal to one.

Example 23. A method comprising: metering a first amount of a first salt comprising a first cation (A) and a halogen (X); metering a second amount of a second salt comprising a second cation (B) and the halogen; and combining the first amount and the second amount, resulting in a first solid mixture, wherein: both the first salt and the second salt are solids, and the first salt and the second salt provide a stoichiometry of the first cation, the second cation, and the anion corresponding to a perovskite.

Example 24. The method of Example 23, further comprising: mixing the first solid mixture, wherein: the mixing converts at least a portion of the first solid mixture to a second solid mixture comprising the perovskite.

Example 25. The method of Example 24, wherein the second solid mixture has a particle size between about 1 μm and about 1 mm.

Example 26. The method of Example 24, wherein the mixing provides to the first solid mixture a specific grinding energy between 0.001 kWhr/kg and 1.0 kWhr/kg.

Example 27. The method of Example 24, wherein the mixing is performed using a ball mill.

Example 28. The method of Example 23, wherein the combining is performed in at least one of a first vessel or a first container.

Example 29. The method of Example 23, wherein the combining is performed on at least one of a conveyor or a weigh scale.

Example 30. The method of Example 24, further comprising, after the combining: storing, for a first period of time, at least one of the first solid mixture or the second solid mixture.

Example 31. The method of Example 30, wherein the first period of time is between 12 hours and six months.

Example 32. The method of Example 30, wherein the first storing is in the at least one of the first vessel or the first container.

Example 33. The method of Example 24, further comprising after the mixing: adding a solvent to the second solid mixture to produce a liquid mixture.

Example 34. The method of Example 33, wherein at least a portion of the second solid mixture dissolves in the solvent.

Example 35. The method of Example 33, wherein the liquid solvent comprises dimethylformamide.

Example 36. The method of Example 33, further comprising after the adding, storing the liquid mixture for a second period of time.

Example 37. The method of Example 36, wherein the second period of time is between 12 hours and six months.

Example 38. The method of Example 37, wherein the storing of the liquid mixture is performed in at least one of the first vessel or the first container.

Example 39. The method of Example 37, wherein the storing of the liquid mixture is performed in at least one of a second vessel or a second container.

Example 40. The method of Example 36, wherein after the storing of the liquid mixture, the liquid mixture is substantially free of dimethylammonium formate (DMAF).

Example 41. The method of Example 40, wherein the absence of DMAF is determined by time-of-flight secondary ion mass spectrometry.

Example 42. The method of Example 36, further comprising, after the storing of the liquid mixture: coating a substrate with the liquid mixture to produce a liquid film comprising the liquid mixture on the substrate, and treating the substrate and the liquid layer to produce a solid film comprising the perovskite.

Example 43. The method of Example 42, wherein the coating is performed using at least one of blade coating, curtain coating, or dip coating.

Example 44. The method of Example 42, wherein the treating is performed by at least one heating the liquid layer, exposing the liquid layer to a second solvent, or exposing the liquid layer to a gas stream.

Example 45. The method of Example 42, wherein the solid film is substantially free of dimethylammonium formate (DMAF).

Example 46. The method of Example 45, wherein the absence of DMAF is determined by time-of-flight secondary ion mass spectrometry.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A method comprising:
    metering a first amount of a first salt comprising a methylammonium halide (MAX);
    metering a second amount of a second salt comprising at least one of a formamidinium halide (FAX) or a cesium halide (CsX);
    metering a third amount of a third salt comprising a $PbI_2$; and
    combining at least two of the first amount, the second amount, or the third amount resulting in a first solid mixture, wherein:
    X comprises at least one of iodide or bromide,
    the first solid mixture is substantially free of dimethylammonium formate (DMAF),
    each of the first salt, the second salt, and the third salt are in a solid form,
    the first salt, the second salt, and the third salt provide a stoichiometry corresponding to a perovskite comprising $Cs_{1-x-y}MA_xFA_yPb(I_{1-w}Br_w)_3$, and
    $0 < x < 1$, $0 < y < 1$, and $0 \leq w \leq 1$.

2. The method of claim 1, further comprising:
    mixing the first solid mixture, wherein:
    the mixing converts at least a portion of the first solid mixture to a second solid mixture comprising the perovskite.

3. The method of claim 2, wherein the second solid mixture has a particle size between 1 μm and 1 mm.

4. The method of claim 2, wherein the mixing provides to the first solid mixture a specific grinding energy between 0.001 kWhr/kg and 1.0 kWhr/kg.

5. The method of claim 2, further comprising after the mixing:
    adding a solvent to the second solid mixture to produce a liquid mixture.

6. The method of claim 5, wherein the liquid solvent comprises dimethylformamide.

7. The method of claim 5, further comprising after the adding, storing the liquid mixture for a first period of time.

8. The method of claim 7, wherein the first period of time is between twelve hours and six months.

9. The method of claim 7, wherein after the storing of the liquid mixture, the liquid mixture is substantially free of DMAF.

10. The method of claim 7, further comprising, after the storing of the liquid mixture:
    coating a substrate with the liquid mixture to produce a liquid film comprising the liquid mixture on the substrate, and
    treating the substrate and the liquid layer to produce a solid film comprising the perovskite.

11. The method of claim 1, further comprising, after the combining, storing the first solid mixture for a second period of time.

12. The method of claim 11, wherein the second period of time is between about twelve hours and six months.

* * * * *